(12) United States Patent
Chen et al.

(10) Patent No.: US 12,040,036 B2
(45) Date of Patent: Jul. 16, 2024

(54) MAGNETIC MEMORY DEVICE

(71) Applicant: Taiwan Semiconductor Manufacturing Co., Ltd., Hsinchu (TW)

(72) Inventors: Chia-Hsiang Chen, Hsinchu (TW); Chih-Yang Chang, Hsinchu (TW); Chia Yu Wang, Hsinchu County (TW); Meng-Chun Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/362,525

(22) Filed: Jul. 31, 2023

(65) Prior Publication Data
US 2023/0410932 A1 Dec. 21, 2023

Related U.S. Application Data

(63) Continuation of application No. 17/807,967, filed on Jun. 21, 2022, now Pat. No. 11,837,312.

(51) Int. Cl.
*G11C 29/44* (2006.01)
*G11C 29/12* (2006.01)
*G11C 29/46* (2006.01)

(52) U.S. Cl.
CPC .... *G11C 29/4401* (2013.01); *G11C 29/12005* (2013.01); *G11C 29/12015* (2013.01); *G11C 29/46* (2013.01)

(58) Field of Classification Search
CPC .......... G11C 29/4401; G11C 29/12005; G11C 29/12015
See application file for complete search history.

(56) References Cited

U.S. PATENT DOCUMENTS

| 8,848,431 B2 * | 9/2014 | Katti ................. G11C 11/16 |
|---|---|---|
| | | 365/158 |
| 2005/0088875 A1 | 4/2005 | Abraham |
| 2016/0071904 A1 | 3/2016 | Katti |

\* cited by examiner

*Primary Examiner* — Han Yang
(74) *Attorney, Agent, or Firm* — Sterne, Kessler, Goldstein & Fox P.L.L.C.

(57) ABSTRACT

The present disclosure describes a magnetic memory device. The magnetic memory device includes a magnetic sensing array configured to sense an external magnetic field strength. The magnetic memory device further includes a voltage modulator configured to, in response to the external magnetic field strength being greater than a threshold magnetic field strength, provide a test voltage different from a current write voltage of the magnetic memory device. The magnetic memory device further includes an error check array configured to use the test voltage as a write voltage of the error check array and provide a bit error rate corresponding to the test voltage. The magnetic memory device further includes a control unit configured to adjust, based on the bit error rate being equal to or less than a threshold bit error rate, a write voltage of the magnetic memory device from the current write voltage to the test voltage.

19 Claims, 23 Drawing Sheets

MAGNETIC MEMORY DEVICE

CROSS-REFERENCE TO RELATED APPLICATIONS

This application is a continuation application of U.S. Non-Provisional patent application Ser. No. 17/807,967, titled "Magnetic Memory Device," filed on Jun. 21, 2022, the disclosures of which are incorporated by reference in their entireties.

BACKGROUND

Magnetoresistive random-access memory (MRAM) is a type of non-volatile random-access memory that stores data in magnetic domains. MRAM has the advantages of low power consumption and high data retention. MRAM can be used in microcontroller units (MCUs), internet of things (IOTs), and wearable devices.

BRIEF DESCRIPTION OF THE DRAWINGS

Aspects of the present disclosure are best understood from the following detailed description when read with the accompanying figures.

DETAILED DESCRIPTION

Figure 1:
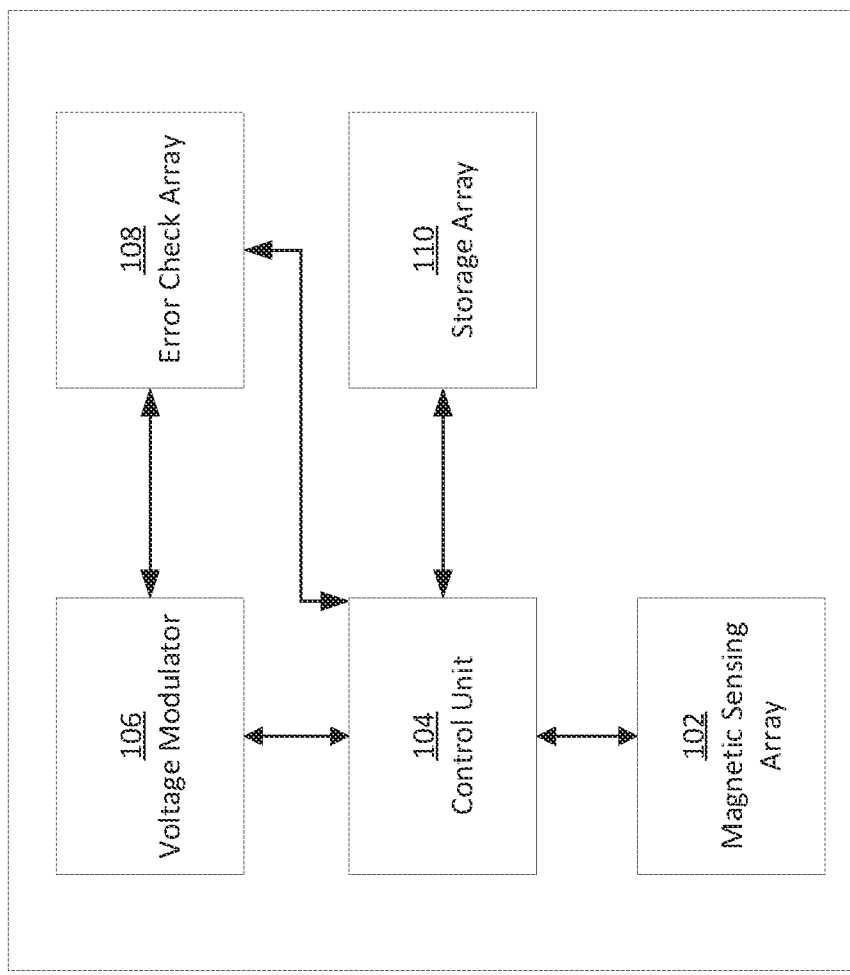
FIG. 1 is a diagram of a magnetic memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1, 2A-2D, 3A, 3B, 4A, 4B, 5A, 5B, 6A, 6B, 7, 8, 9A, 9B, 10, 11, 12A, 12B, and 13 with the same annotations applies to each other, unless mentioned otherwise.

Magnetoresistive random-access memory (MRAM) is a type of non-volatile random-access memory that stores data in magnetic domains. MRAM can include a number of magnetic memory cells. Each magnetic memory cell can include a magnetic data cell and a reference cell. The magnetic data cell can include a magnetic tunneling junction and one or two transistors. The magnetic tunneling junction can include a nonmagnetic layer interposed between a first magnetic layer and a second magnetic layer. The first magnetic layer can have a fixed magnetization direction. The second magnetic layer can have two magnetization directions. When the magnetization direction of the second magnetic layer is parallel to the fixed magnetization direction of the first magnetic layer, a first logical value (e.g., a logical 0) can be stored. When the magnetization direction of the second magnetic layer is antiparallel to the fixed magnetization direction of the first magnetic layer, a second logical value (e.g., a logical 1) can be stored.

To change from the first logical value (e.g., a logical 0) to the second logical value (e.g., a logical 1), a first write voltage (e.g., a write 1 voltage) can be applied to change the magnetization direction of the second magnetic layer from being parallel to being antiparallel to the fixed magnetization direction of the first magnetic layer. To change from the second logical value (e.g., a logical 1) to the first logical value (e.g., a logical 0), a second write voltage (e.g., a write 0 voltage) can be applied to change the magnetization direction of the second magnetic layer from being antiparallel to being parallel to the fixed magnetization direction of the first magnetic layer. To read the first logical value (e.g., a logical 0) or the second logical value (e.g., a logical 1), a read voltage can be applied. Once the magnetization of the second magnetic layer is completed, the magnetization can remain for a substantially long time. Therefore, MRAM can have very high data retention. Furthermore, unlike in dynamic random-access memory (DRAM) where the data is periodically refreshed, or in static random-access memory (SRAM) where a power supply must be continuously maintained, MRAM has the advantage of low power consumption because there is no need to refresh the data. However, when an external magnetic field exists, such as a permanent magnet, if the write voltage of the MRAM remains the same, the external magnetic field can cause write errors. The write errors can reduce MRAM data storage accuracy and reliability.

The present disclosure provides an example magnetic memory device with improved data storage accuracy and reliability and an example method for operating the same. The magnetic memory device can include a magnetic sensing array. The magnetic sensing array can include a number of magnetic sensing elements with initial logical values of 0 or 1 arranged in a pattern. The magnetic sensing array can sense an external magnetic field strength based on a flip rate of the initial logical values under the influence of the external magnetic field. If the sensed external magnetic field strength is below a threshold magnetic field strength, the external magnetic field has no effect on data storage accuracy and reliability and the write voltage of the magnetic memory device can remain the same. In some embodiments, for example, if the sensed external magnetic field strength is below about 100 Oersted (Oe), the write voltage of the magnetic memory device can remain the same. If the sensed external magnetic field strength is above the threshold magnetic field strength, the external magnetic field can reduce data storage accuracy and reliability and the write voltage of the magnetic memory device may need to be adjusted. In some embodiments, for example, if the sensed external magnetic field strength is between about 100 Oe and about 1000 Oe, the write voltage of the magnetic memory device will need to be adjusted. If the sensed external magnetic field strength is above about 1000 Oe, write operations to the magnetic memory device with any write voltage can cause data loss and errors. Therefore, new write operations should not be performed. Data already stored in the magnetic memory device can have a higher tolerance for the external magnetic field and read operations can cause less volatility of the data than write operations. Therefore, read operations of data already stored in the magnetic memory device can be performed.

To adjust the write voltage of the magnetic memory device, the magnetic memory device can include a voltage modulator and an error check array. The voltage modulator can provide a test voltage different from a current write voltage of the magnetic memory device. The error check array can use the test voltage as the write voltage to write logical values and provide a bit error rate. In some embodiments, the test voltage can be repeated between about 2 and 10000 cycles to improve the accuracy of the bit error rate. If the bit error rate is equal to or less than a threshold bit error rate, the test voltage can be used as the new write voltage under the influence of the sensed external magnetic field. If the bit error rate is greater than the threshold bit error rate, the test voltage is not a suitable write voltage under the influence of the sensed external magnetic field and a new test voltage will need to be tested. In some embodiments, between about 3 and about 100 test voltages can be tested to find the suitable new write voltage.

In some embodiments, the external magnetic field can be sensed before every write operation. In some embodiments, the external magnetic field can be sensed periodically, such as after 10 write operations, after 100 write operations, or after 1000 write operations. The magnetic memory device with the magnetic sensing array, the voltage modulator, and the error check array can adjust write voltages according to external magnetic field strengths. The adjusted write voltages can improve data storage accuracy and reliability.

FIG. 1 is a diagram of a magnetic memory device 100, according to some embodiments. Magnetic memory device 100 can include a magnetic sensing array 102, a control unit 104, a voltage modulator 106, an error check array 108, and a storage array 110. Control unit 104 can include transistors, resistors, capacitors, and other components. Control unit 104 can receive and send data and command signals between control unit 104 and magnetic sensing array 102, voltage modulator 106, error check array 108, and storage array 110. Magnetic sensing array 102 can sense an external magnetic field strength. In some embodiments, magnetic sensing array 102 can sense the external magnetic field strength based on a flip rate of initial logical values of magnetic sensing array 102 under the influence of the external magnetic field. Control unit 104 can send a command signal to command magnetic sensing array 102 to sense the external magnetic field strength. The command signal can be sent before every write operation or periodically such as after a certain number of write operations. The sensed external magnetic field strength can be sent from magnetic sensing array 102 to control unit 104. Control unit 104 can compare the sensed magnetic field strength with a threshold magnetic field strength. If control unit 104 determines that the sensed magnetic field strength is below the threshold magnetic field strength, control unit 104 can send a write signal to write to storage array 110 with a current write voltage. If control unit 104 determines that the sensed magnetic field strength is above the threshold magnetic field strength, control unit 104 can adjust the current write voltage. Control unit 104 can command voltage modulator 106 and error check array 108 to adjust the current write voltage.

Voltage modulator 106 can include transistors, resistors, capacitors, and other components. In response to a determination that the sensed magnetic field strength is above the threshold magnetic field strength, control unit 104 can send a command signal to voltage modulator 106 to provide a test voltage. The test voltage can be sent from voltage modulator 106 to error check array 108 and control unit 104. Control unit 104 can send a command signal to error check array 108 to check whether the test voltage provided by voltage modulator 106 can be a suitable new write voltage under the influence of the sensed external magnetic field. Error check array 108 can write the same logical values to a number of error check elements as the initial logical values of the error check elements. Control unit 104 can read the initial logical values of the error check elements. Control unit 104 can read the written logical values of the error check elements. Control unit 104 can compare the written logical values and the initial logical values to calculate a bit error rate. In some embodiments, error check array 108 can calculate the bit error rate and provide the bit error rate to control unit 104.

Control unit 104 can compare the bit error rate with a threshold bit error rate. If control unit 104 determines that the bit error rate is equal to or less than the threshold bit error rate, the test voltage can be a suitable new write voltage. Control unit 104 can adjust the current write voltage to the test voltage and send a write signal to write to storage array 110 with the adjusted write voltage. If control unit 104 determines that the bit error rate is greater than the threshold bit error rate, the test voltage is not a suitable new write voltage. Control unit 104 can send a command signal to voltage modulator 106 to provide a new test voltage. Control unit 104 can command voltage modulator 106 to provide as many test voltages as needed until a suitable new write voltage is obtained. In some embodiments, control unit 104 can send one command signal to voltage modulator 106, and voltage modulator 106 can provide more than one test voltage after executing the one command signal. Storage array 110 can store data in magnetic domains using the current write voltage or the adjusted write voltage, depending on the command signals from control unit 104. Control unit 104 can also send a read signal to read storage array 110.

FIGS. 2A-2D illustrate a magnetic memory device, such as magnetic memory device 100, according to some embodiments. The magnetic memory device can include magnetic sensing array 102, control unit 104, voltage modulator 106, error check array 108, and storage array 110. In some embodiments, magnetic sensing array 102, error check array 108, and storage array 110 can each include a number of magnetic memory cells. In some embodiments, magnetic sensing array 102, error check array 108, and storage array 110 can include magnetic memory cells in different sections of the same array of magnetic memory cells. For example, magnetic sensing array 102 can include a section 102 of an array of magnetic memory cells. Error check array 108 can include sections 108 of the array of magnetic memory cells. Storage array 110 can include the remaining portions 110 of the array of magnetic memory cells. In some embodiments, magnetic sensing array 102 can occupy less than about 1% of the array of magnetic memory cells. In some embodiments, magnetic sensing array 102 can include a section of magnetic memory cells that are more sensitive to external magnetic fields. For example, magnetic memory cells within magnetic sensing array 102 can flip logical values under the influence of external magnetic fields more easily than other magnetic memory cells within storage array 110. This can allow magnetic sensing array 102 to sense external magnetic fields more accurately and quickly before the external magnetic fields cause data discrepancy in storage array 110. In some embodiments, magnetic sensing array 102 can be located at an upper left corner of the array of magnetic memory cells.

Figure 2A:
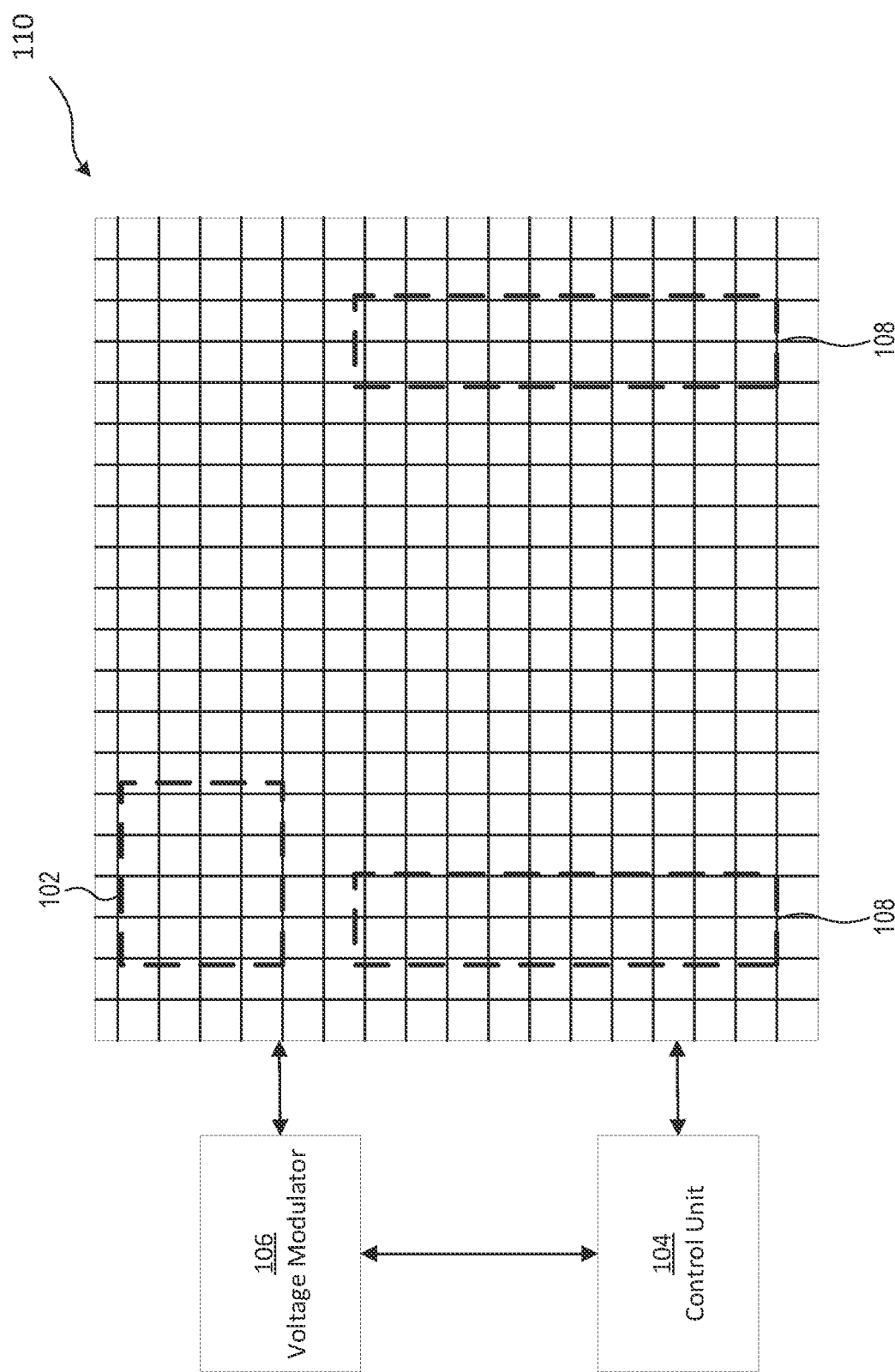
FIGS. 2A-2D illustrate a magnetic memory device, in accordance with some embodiments.
Figure 2B:
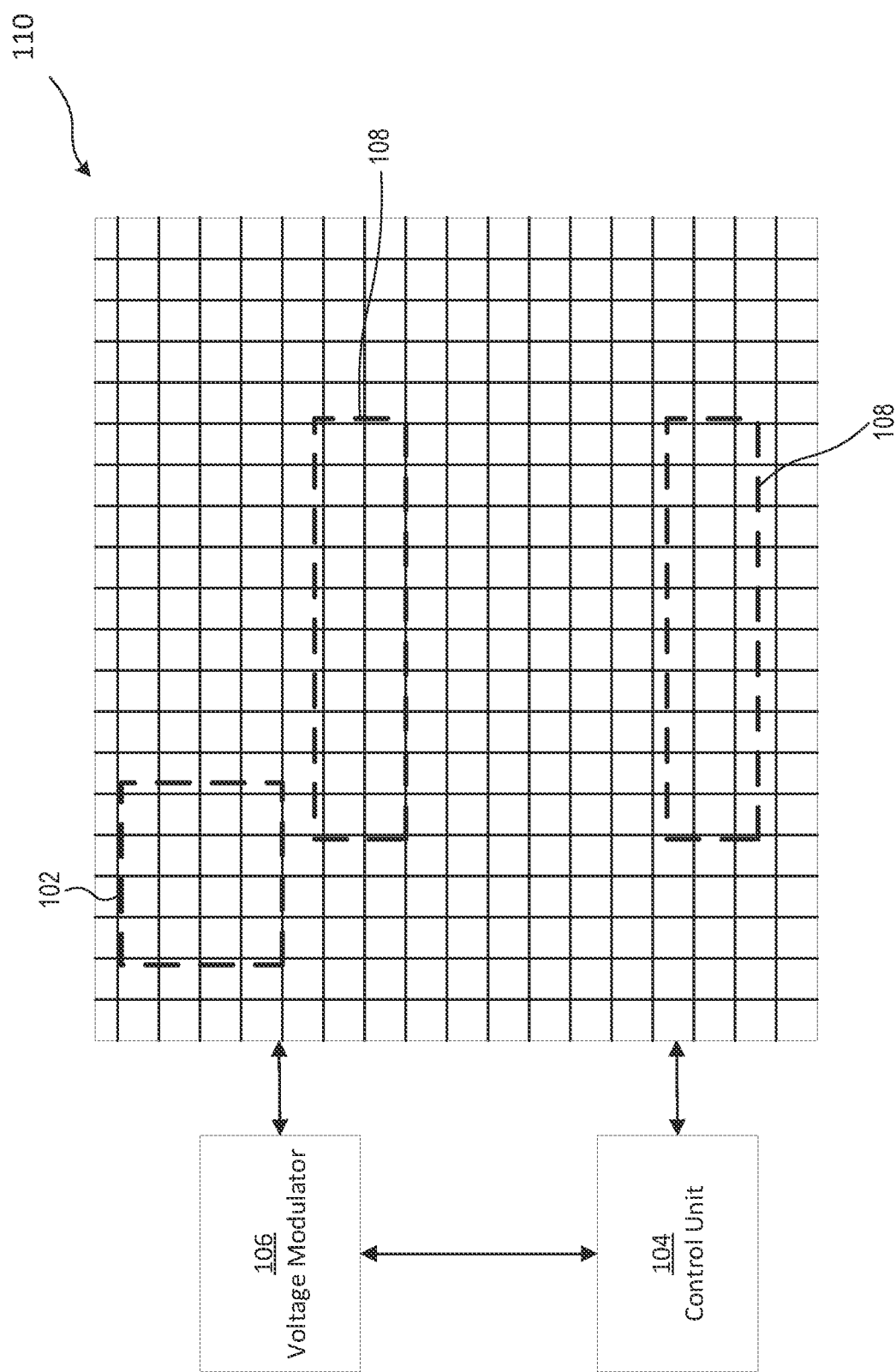
Figure 2C:
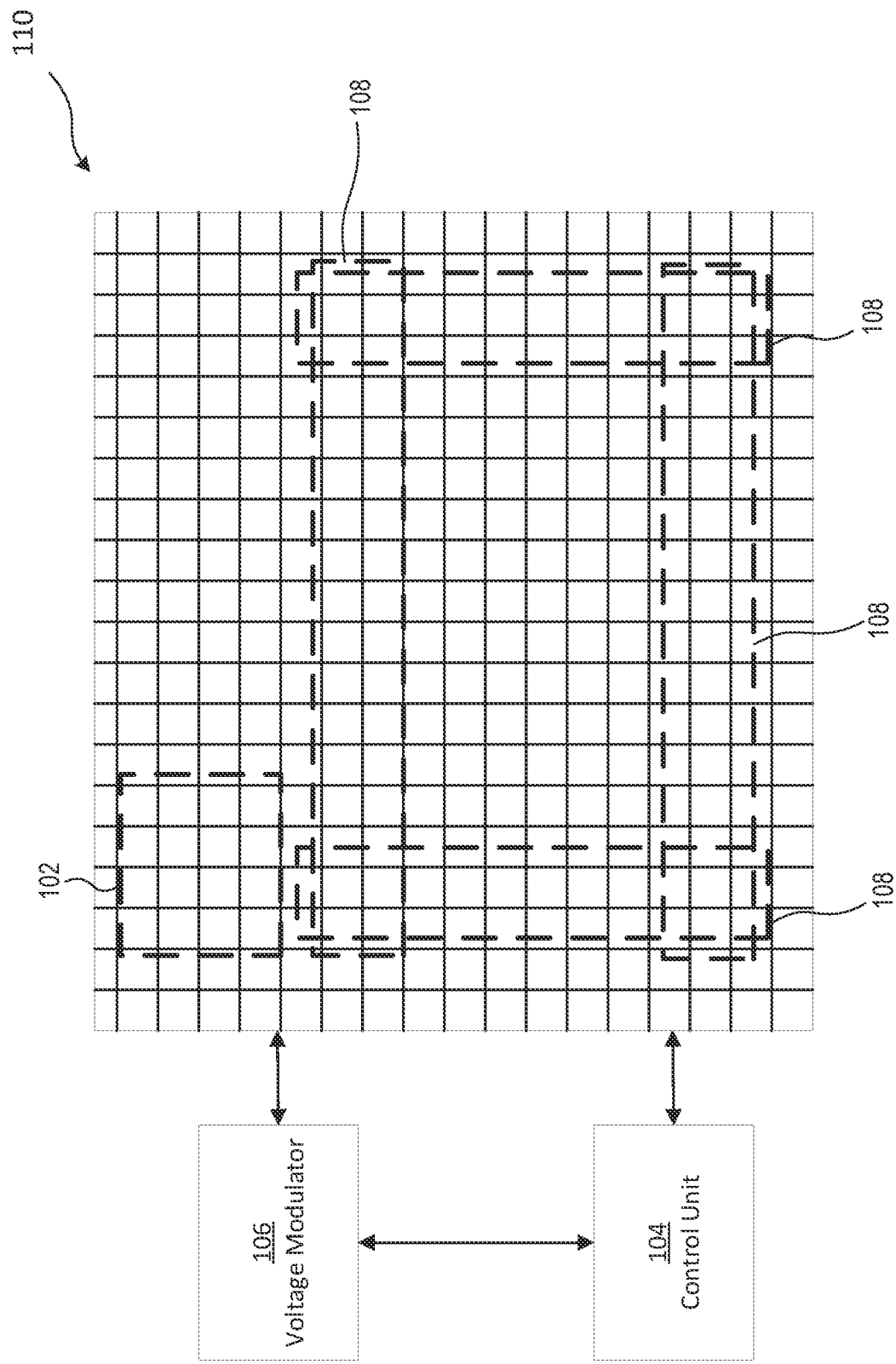
Figure 2D:
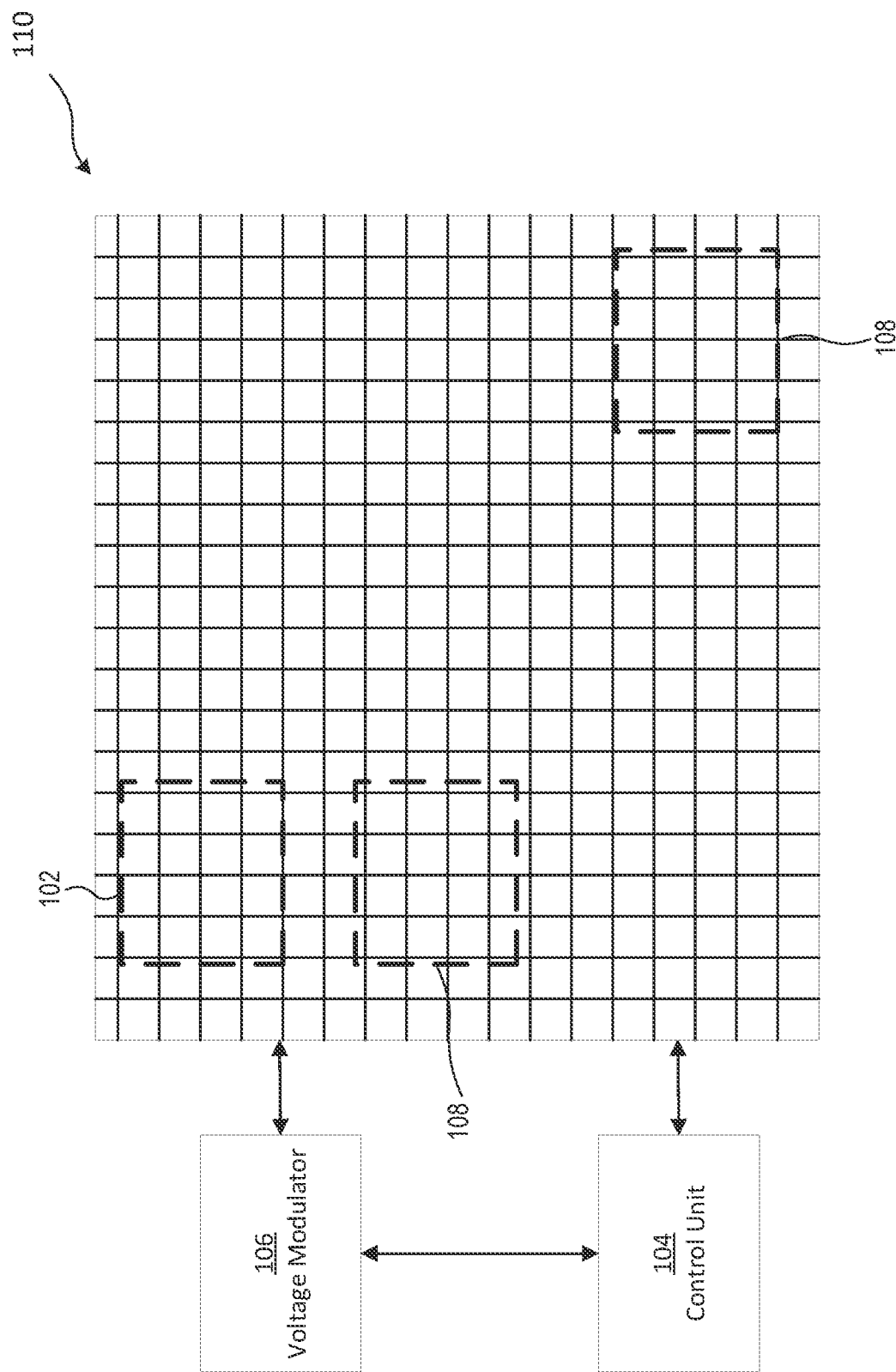

Error check array 108 can be placed at different locations on the array of magnetic memory cells. By placing error check array 108 at different locations, a bit error rate corresponding to a test voltage can be more representative over the entire array of magnetic memory cells. Referring to FIG. 2A, error check array 108 can include two vertical strips. The first vertical strip can be placed toward the lower left end of the array of magnetic memory cells. The second vertical strip can be placed toward the lower right end of the array of magnetic memory cells. Referring to FIG. 2B, error check array 108 can include two horizontal strips. The first horizontal strip can be placed toward the upper center of the array of magnetic memory cells. The second horizontal strip can be placed toward the lower center of the array of magnetic memory cells. Referring to FIG. 2C, error check array 108 can include two horizontal strips and two vertical strips. The first horizontal strip can be placed toward the upper center of the array of magnetic memory cells. The second horizontal strip can be placed toward the lower center of the array of magnetic memory cells. The first vertical strip can be placed toward the lower left end of the array of magnetic memory cells. The second vertical strip can be placed toward the lower right end of the array of magnetic memory cells. Referring to FIG. 2D, error check array 108 can include two square sections. The first square section can be placed toward the upper left corner of the array of magnetic memory cells. The second square section can be placed toward the lower right corner of the array of magnetic memory cells.

Figure 3B:
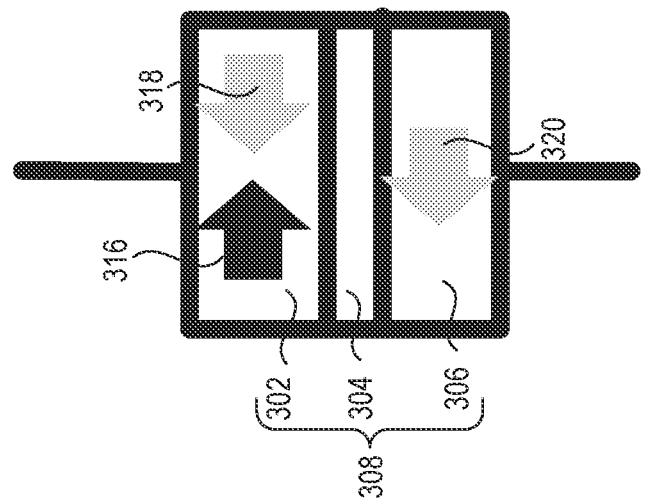
FIGS. 3A and 3B are diagrams of a magnetic tunneling junction, in accordance with some embodiments.
Figure 3A:
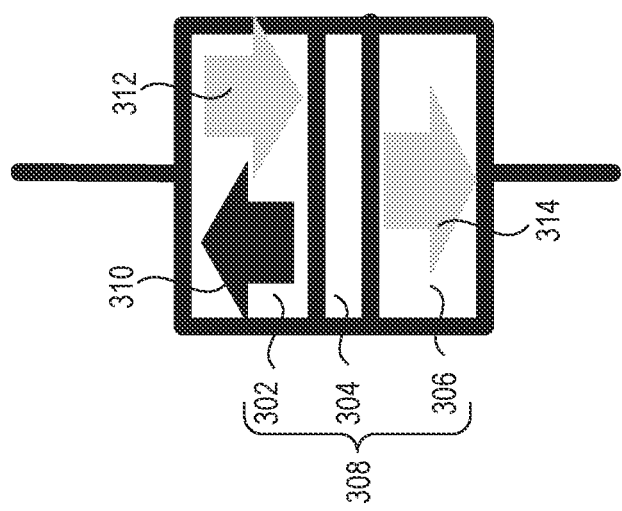

FIGS. 3A and 3B are diagrams of a magnetic tunneling junction 308, according to some embodiments. Magnetic tunneling junction 308 can include a nonmagnetic layer 304 interposed between a first magnetic layer 306 and a second magnetic layer 302. First magnetic layer 306 and second magnetic layer 302 can have magnetization directions. Referring to FIG. 3A, first magnetic layer 306 and second magnetic layer 302 can have perpendicular magnetization directions. First magnetic layer 306 can have a fixed magnetization direction 314. Second magnetic layer 302 can have a first magnetization direction 312 and a second magnetization direction 310. When second magnetic layer 302 has first magnetization direction 312, which is parallel to fixed magnetization direction 314 of first magnetic layer 306, a logical 0 can be stored. When second magnetic layer 302 has second magnetization direction 310, which is antiparallel to fixed magnetization direction 314 of first magnetic layer 306, a logical 1 can be stored. To change a logical 0 to a logical 1, a write 1 voltage can be applied to change the magnetization direction of second magnetic layer 302 from first magnetization direction 312 to second magnetization direction 310. To change a logical 1 to a logical 0, a write 0 voltage can be applied to change the magnetization direction of second magnetic layer 302 from second magnetization direction 310 to first magnetization direction 312.

Referring to FIG. 3B, first magnetic layer 306 and second magnetic layer 302 can have in-plane magnetization directions. First magnetic layer 306 can have a fixed magnetization direction 320. Second magnetic layer 302 can have a first magnetization direction 318 and a second magnetization direction 316. When second magnetic layer 302 has first magnetization direction 318, which is parallel to fixed magnetization direction 320 of first magnetic layer 306, a logical 0 can be stored. When second magnetic layer 302 has second magnetization direction 316, which is antiparallel to fixed magnetization direction 320 of first magnetic layer 306, a logical 1 can be stored. To change a logical 0 to a logical 1, a write 1 voltage can be applied to change the magnetization direction of second magnetic layer 302 from first magnetization direction 318 to second magnetization direction 316. To change a logical 1 to a logical 0, a write 0 voltage can be applied to change the magnetization direction of second magnetic layer 302 from second magnetization direction 316 to first magnetization direction 318. In some embodiments, magnetic tunneling junctions 308 with perpendicular magnetization directions can be used. In some embodiments, magnetic tunneling junctions 308 with in-plane magnetization directions can be used. In some embodiments, magnetic tunneling junctions 308 with perpendicular magnetization directions and magnetic tunneling junctions 308 with in-plane magnetization directions can be used together.

Figure 4A:
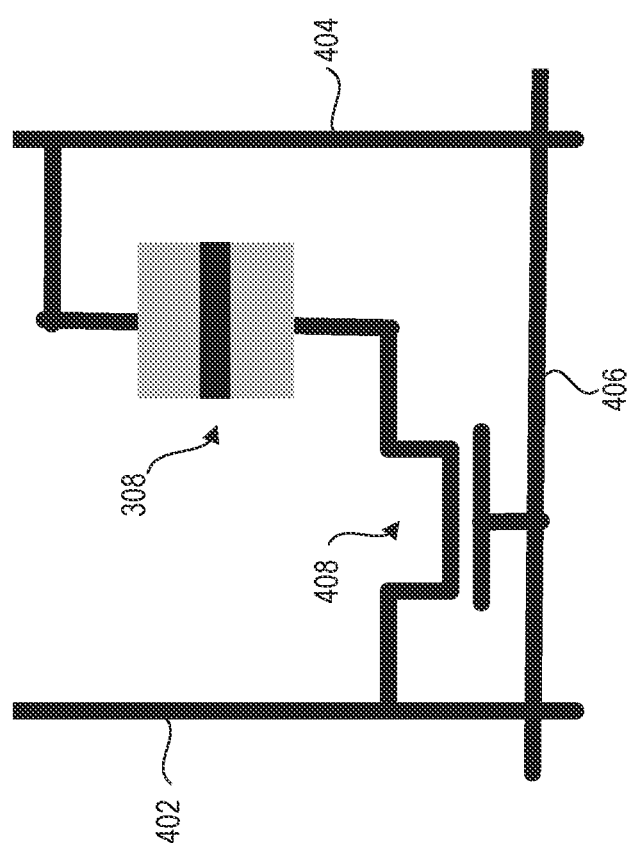
FIGS. 4A and 4B are diagrams of a magnetic data cell, in accordance with some embodiments.
Figure 4B:
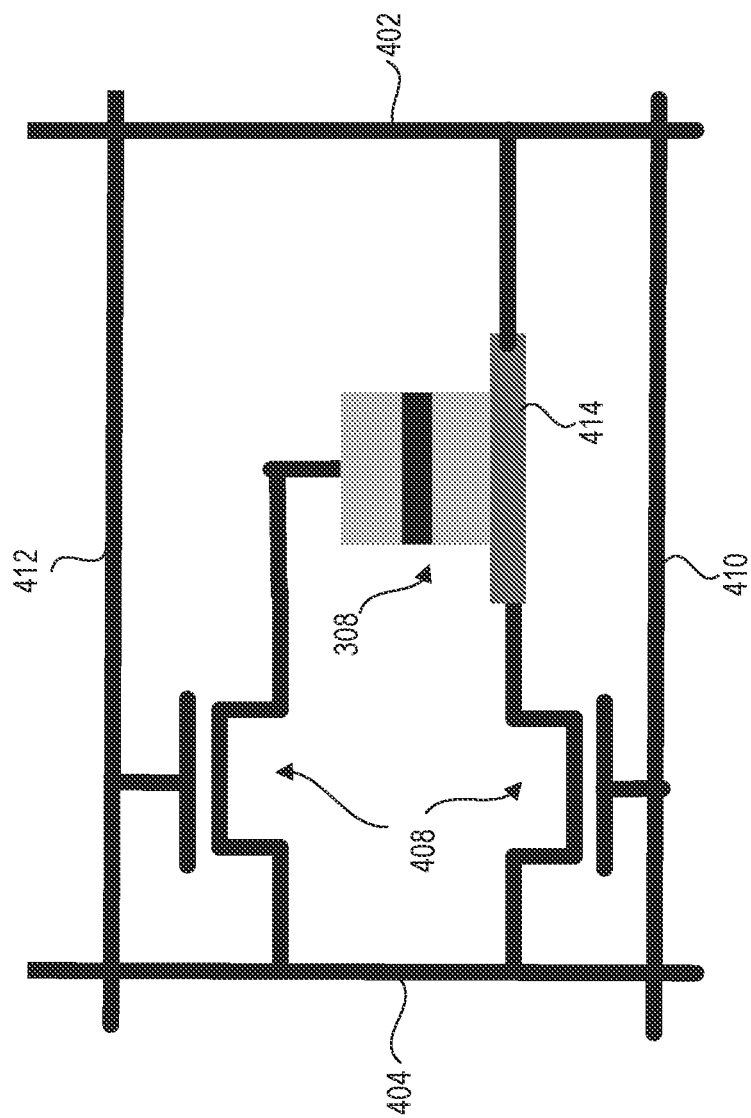

FIGS. 4A and 4B are diagrams of a magnetic data cell, according to some embodiments. Referring to FIG. 4A, the magnetic data cell can include one magnetic tunneling junction 308, such as shown in FIG. 3A or 3B, and one transistor 408. The magnetic data cell can include a bit line 404, a word line 406, and a select line 402. Referring to FIG. 4B, the magnetic data cell can include one magnetic tunneling junction 308, such as shown in FIG. 3A or 3B, and two transistors 408. The magnetic data cell can include bit line 404, select line 402, a write word line 410, and a read word line 412. The magnetic data cell can include a heavy metal 414. Heavy metal 414 can generate spin current to control the magnetization dynamics of magnetic tunneling junction 308 by spin-orbit torque. Heavy metal 414 can improve the performance of magnetic tunneling junction 308.

Figure 5A:
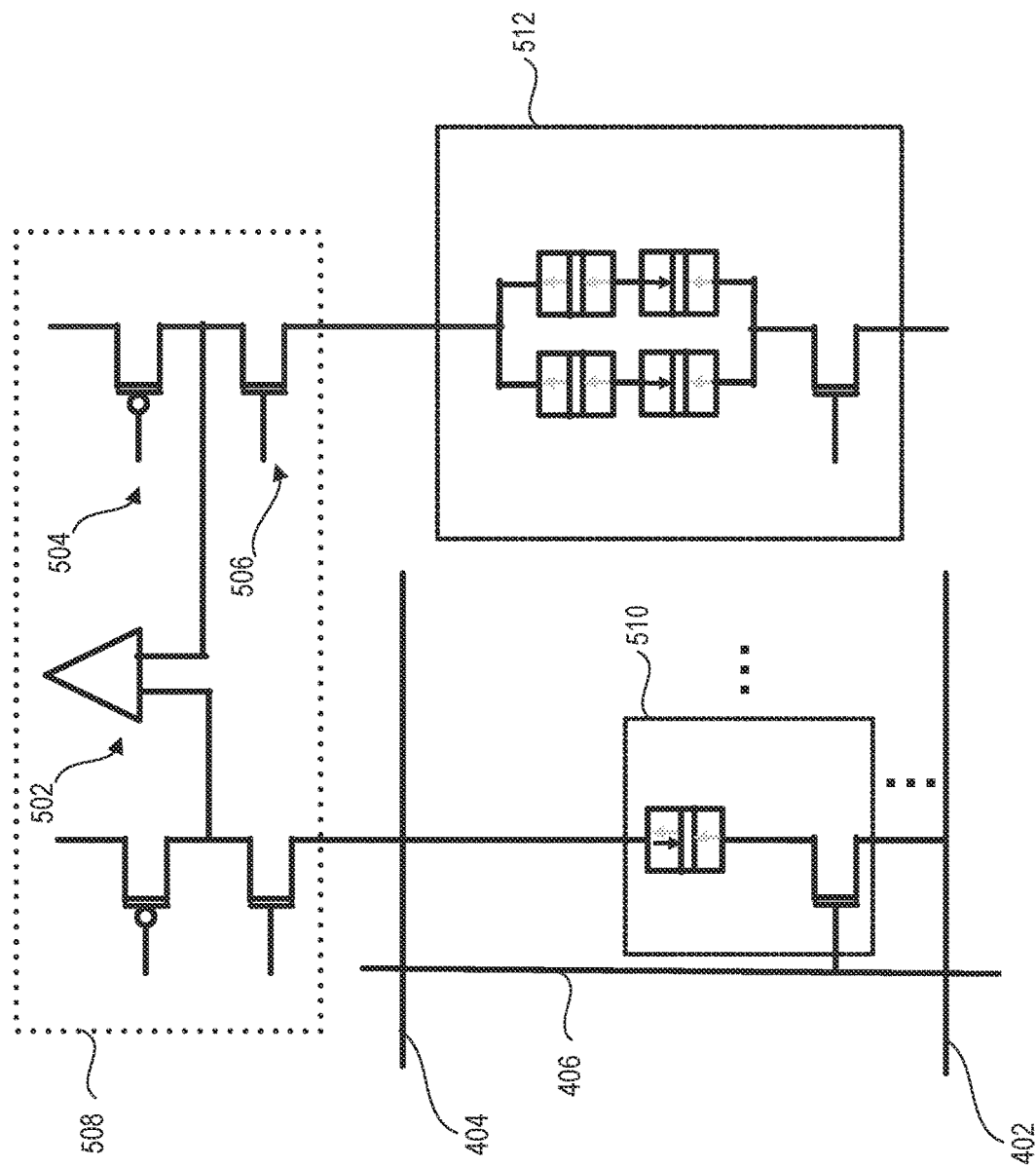
FIGS. 5A and 5B are diagrams of a magnetic memory cell, in accordance with some embodiments.
Figure 5B:
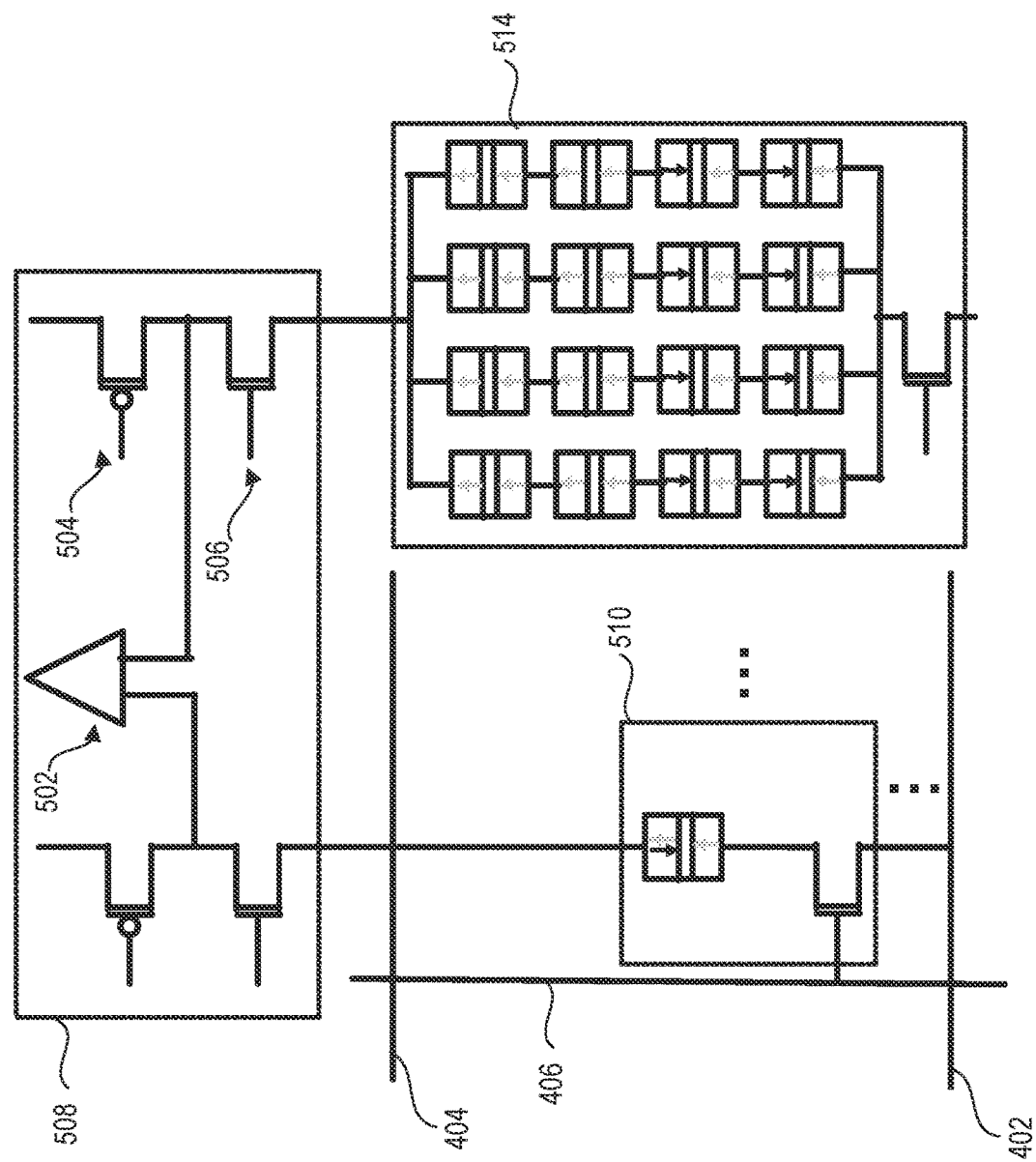

FIGS. 5A and 5B are diagrams of a magnetic memory cell, according to some embodiments. Referring to FIG. 5A, the magnetic memory cell can include a magnetic data cell 510, which can include one magnetic tunneling junction and one transistor such as shown in FIG. 4A. In some embodiments, magnetic data cell 510 can include one magnetic tunneling junction and two transistors such as shown in FIG. 4B. The magnetic memory cell can include a reference cell 512. Reference cell 512 can include two magnetic tunneling junctions in a permanent parallel state, two magnetic tunneling junctions in a permanent antiparallel state, and one transistor. The magnetic memory cell can include select line 402, word line 406, and bit line 404. The magnetic memory cell can include a comparison circuit 508. Comparison circuit 508 can include load transistors 504, clamp transistors 506, and a voltage comparator 502.

Referring to FIG. 5B, the magnetic memory cell can include magnetic data cell 510, select line 402, word line 406, bit line 404, comparison circuit 508, and a reference cell 514. Reference cell 514 can include eight magnetic tunneling junctions in a permanent parallel state, eight magnetic tunneling junctions in a permanent antiparallel state, and one transistor. Magnetic memory cells as shown in FIG. 5A or 5B can be the magnetic memory cells that constitute the array of magnetic memory cells as shown in FIGS. 2A-2D. Therefore, magnetic sensing array 102, error check array 108, and storage array 110 can include magnetic memory cells as shown in FIG. 5A or 5B.

Figure 6A:
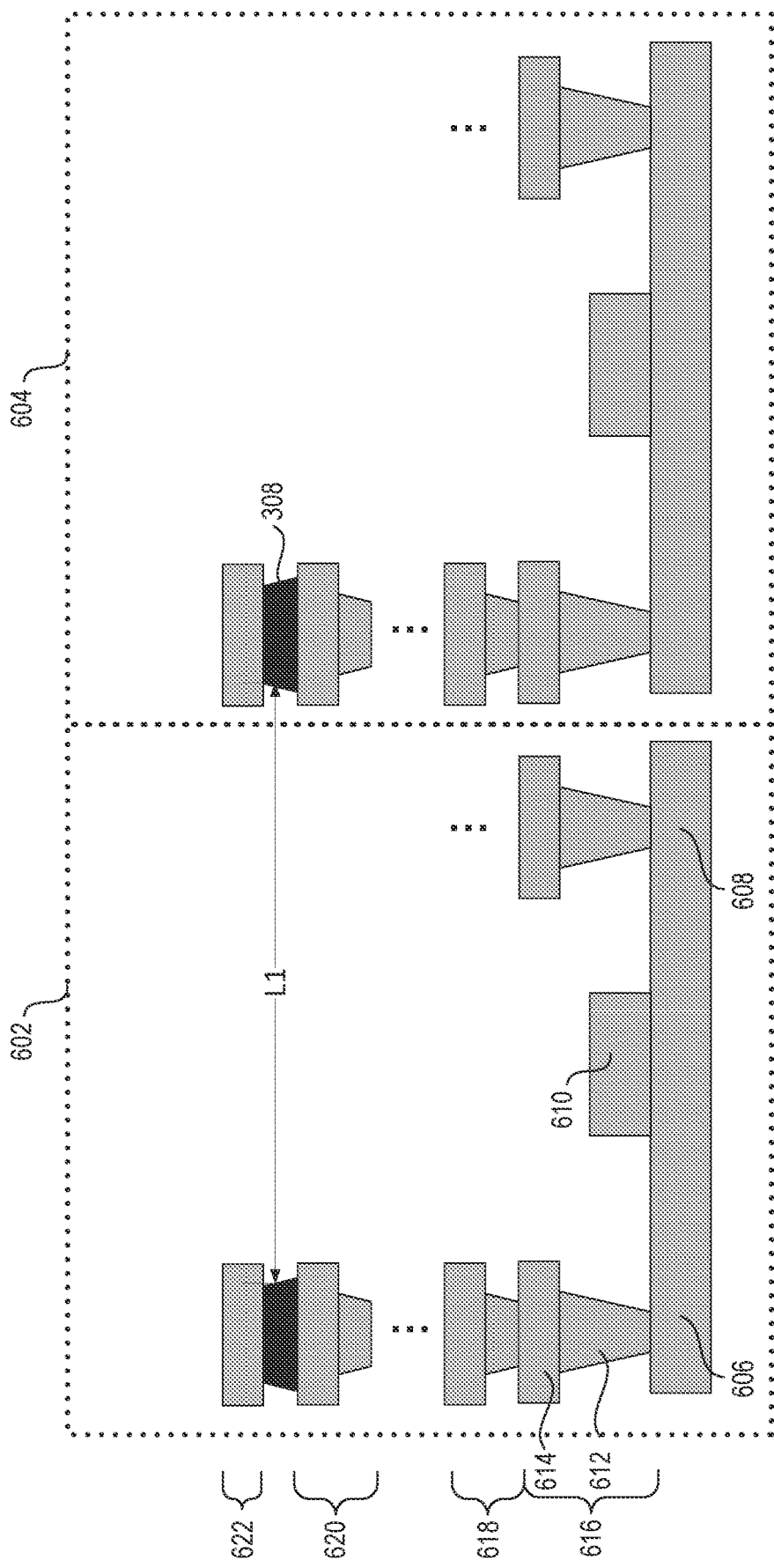
FIGS. 6A and 6B illustrate cross-sectional views of a magnetic data cell, in accordance with some embodiments.
Figure 6B:
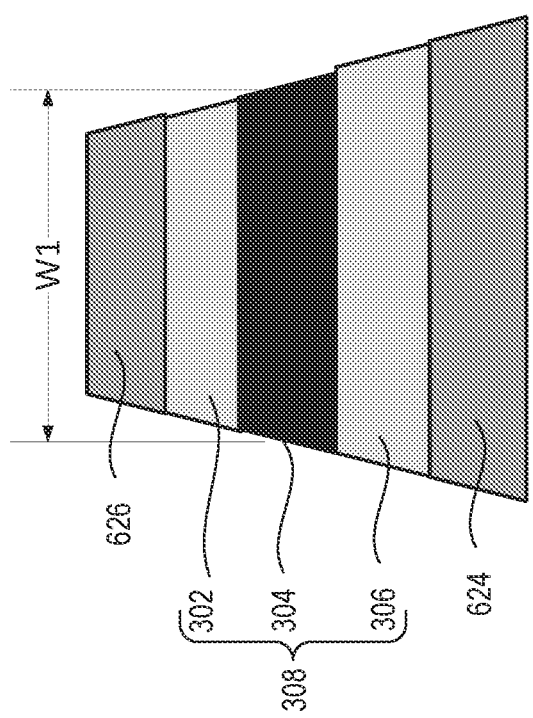

FIGS. 6A and 6B illustrate cross-sectional views of magnetic data cells 602 and 604, according to some embodiments. Referring to FIG. 6A, magnetic data cell 602 or 604 can include one magnetic tunneling junction 308 and one transistor. In some embodiments, FIG. 4A can be a diagram of magnetic data cell 602 or 604. In some embodiments, magnetic data cell 602 or 604 can include one magnetic tunneling junction 308 and two transistors (not shown in FIG. 6A). In some embodiments, FIG. 4B can be a diagram of magnetic data cell 602 or 604. The transistor can include a gate structure 610, a source 608, and a drain 606. Magnetic data cell 602 or 604 can include a first metal layer 616, a second metal layer 618, . . . , an Nth metal layer 620, and an (N+1)th metal layer 622. First metal layer 616 can include a metal via structure 612 and a metal line 614. Magnetic tunneling junction 308 can be interposed between Nth layer 620 and (N+1)th metal layer 622. In some embodiments, magnetic tunneling junction 308 can be located on the same level as the transistor. In some embodiments, magnetic tunneling junction 308 can be interposed between metal layers other than Nth metal layer 620 and (N+1)th metal layer 622. A distance L1 between adjacent magnetic data cell 602 and magnetic data cell 604 can be between about 200 nm and about 500 nm, between about 100 nm and about 800 nm, and between about 10 nm and about 1000 nm. If distance L1 is greater than about 1000 nm, the density of magnetic data cells 602 and 604 can be too low. The density of magnetic data cells 602 and 604 can be too low if the bit density of the array of magnetic memory cells is below about 50 kb/mm$^2$. If distance L1 is less than about 10 nm, the manufacturing difficulty can be too great and the manufacturing cost can be too high.

Referring to FIG. 6B, magnetic tunneling junction 308 can have a stacked structure including nonmagnetic layer 304, first magnetic layer 306, and second magnetic layer 302. Nonmagnetic layer 304 can include a nonmagnetic material including magnesium oxide ($MgO_x$), aluminum oxide ($AlO_x$), copper (Cu), aluminum (Al), ruthenium (Ru), Iridium (Ir), and combinations thereof. First magnetic layer 306 and second magnetic layer 302 can include a magnetic material including iron (Fe), cobalt (Co), nickel (Ni), chromium (Cr), alloys of Fe, Co, Ni, and/or Cr, compounds containing Fe, Co, Ni, and/or Cr, and combinations thereof. A top contact 626 can be disposed on top of magnetic tunneling junction 308 and a bottom contact 624 can be disposed below magnetic tunneling junction 308. Top contact 626 and bottom contact 624 can include a conductive material including Cu, tungsten (W), and combinations thereof. Magnetic tunneling junction 308 can have a width W1 between about 200 nm and about 500 nm, between about 100 nm and about 800 nm, and between about 10 nm and about 1000 nm. If width W1 is greater than about 1000 nm, the density of magnetic data cells 602 and 604 can be too low. The density of magnetic data cells 602 and 604 can be too low if the bit density of the array of magnetic memory cells is below about 50 kb/mm$^2$. If width W1 is less than about 10 nm, the manufacturing difficulty can be too great and the manufacturing cost can be too high. In some embodiments, magnetic tunneling junction 308 can have a tapered structure. For example, magnetic tunneling junction 308 can be narrower toward the top and wider toward the bottom.

Figure 7:
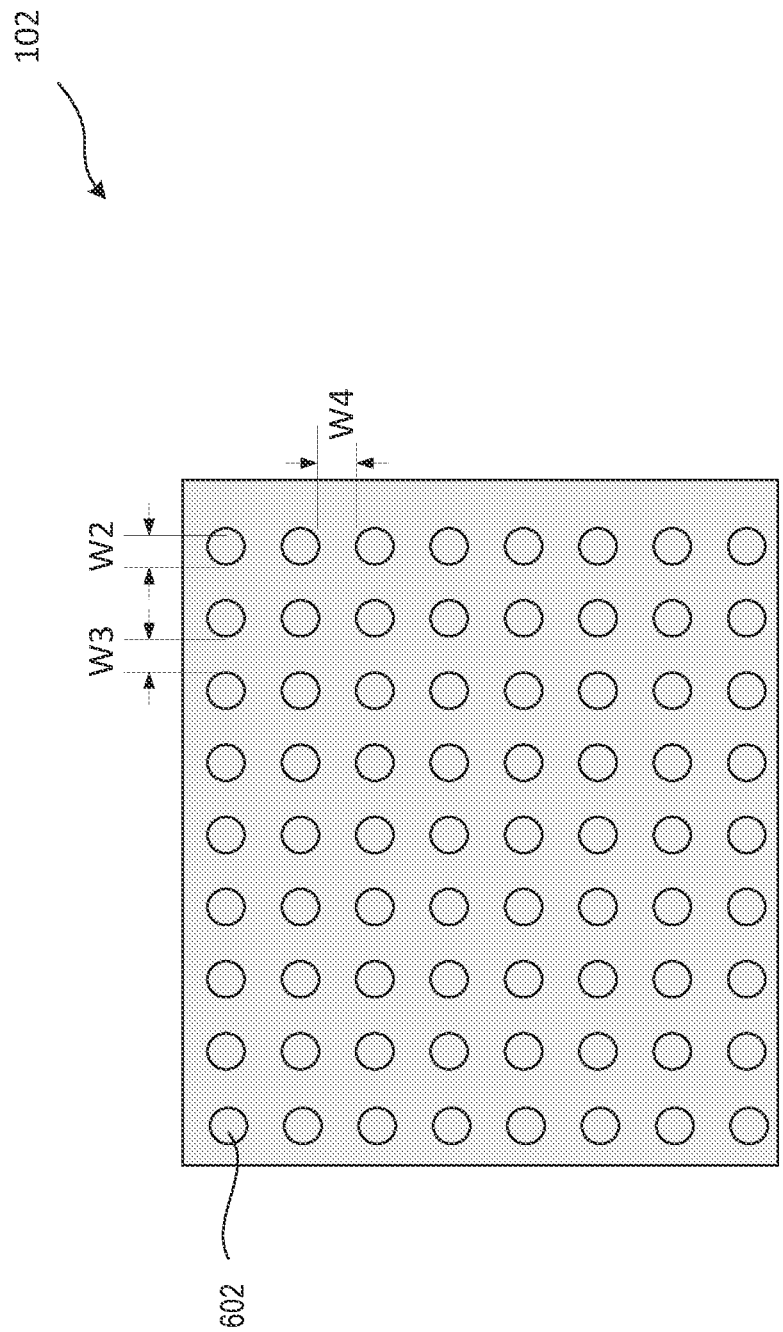
FIG. 7 illustrates a top view of a magnetic sensing array, in accordance with some embodiments.

FIG. 7 illustrates a top view of magnetic sensing array 102, according to some embodiments. Magnetic sensing array 102 can include a number of magnetic sensing elements arranged in a pattern. In some embodiments, magnetic sensing array 102 can include a number of magnetic data cells 602 arranged in a pattern. In some embodiments, magnetic sensing array 102 can include a number of magnetic memory cells as shown in FIGS. 5A and 5B arranged in a pattern. The magnetic sensing elements can have a circular shape as shown in FIG. 7. The magnetic sensing elements can have other shapes including a square shape, a triangular shape, a rectangular shape, an oval shape, and combinations thereof. The shape of the magnetic sensing elements can affect the sensitivity of magnetic sensing array 102 to sense external magnetic fields. For example, circular magnetic sensing elements can have a smaller area than square magnetic sensing elements when the diameter of the circular magnetic sensing elements is the same as the side length of the square magnetic sensing elements. Therefore, magnetic sensing array 102 with circular magnetic sensing elements can have a lower sensitivity than magnetic sensing array 102 with square magnetic sensing elements when the diameter of the circular magnetic sensing elements is the same as the side length of the square magnetic sensing elements.

Each magnetic sensing element can have a width W2 between about 50 nm and about 100 nm, between about 30 nm and about 150 nm, and between about 10 nm and about 200 nm. If width W2 is greater than about 200 nm, the density of the magnetic sensing elements can be too low. The density of the magnetic sensing elements can be too low if the bit density of magnetic sensing array 102 is below about 50 kb/mm$^2$. If width W2 is less than about 10 nm, the sensitivity of magnetic sensing array 102 can be too low. Adjacent columns of magnetic sensing elements can have a spacing W3 between about 200 nm and about 500 nm, between about 100 nm and about 800 nm, and between about 10 nm and about 1000 nm. If spacing W3 is greater than about 1000 nm, the sensitivity of magnetic sensing array 102 can be too low and the density of the magnetic sensing elements can be too low. The density of the magnetic sensing elements can be too low if the bit density of magnetic sensing array 102 is below about 50 kb/mm$^2$. If spacing W3 is less than about 10 nm, the manufacturing difficulty can be too great and the manufacturing cost can be too high. Adjacent rows of magnetic sensing elements can have a spacing W4 between about 200 nm and about 500 nm, between about 100 nm and about 800 nm, and between about 10 nm and about 1000 nm. If spacing W4 is greater than about 1000 nm, the sensitivity of magnetic sensing array 102 can be too low and the density of the magnetic sensing elements can be too low. The density of the magnetic sensing elements can be too low if the bit density of magnetic sensing array 102 is below about 50 kb/mm$^2$. If spacing W4 is less than about 10 nm, the manufacturing difficulty can be too great and the manufacturing cost can be too high.

Figure 8:
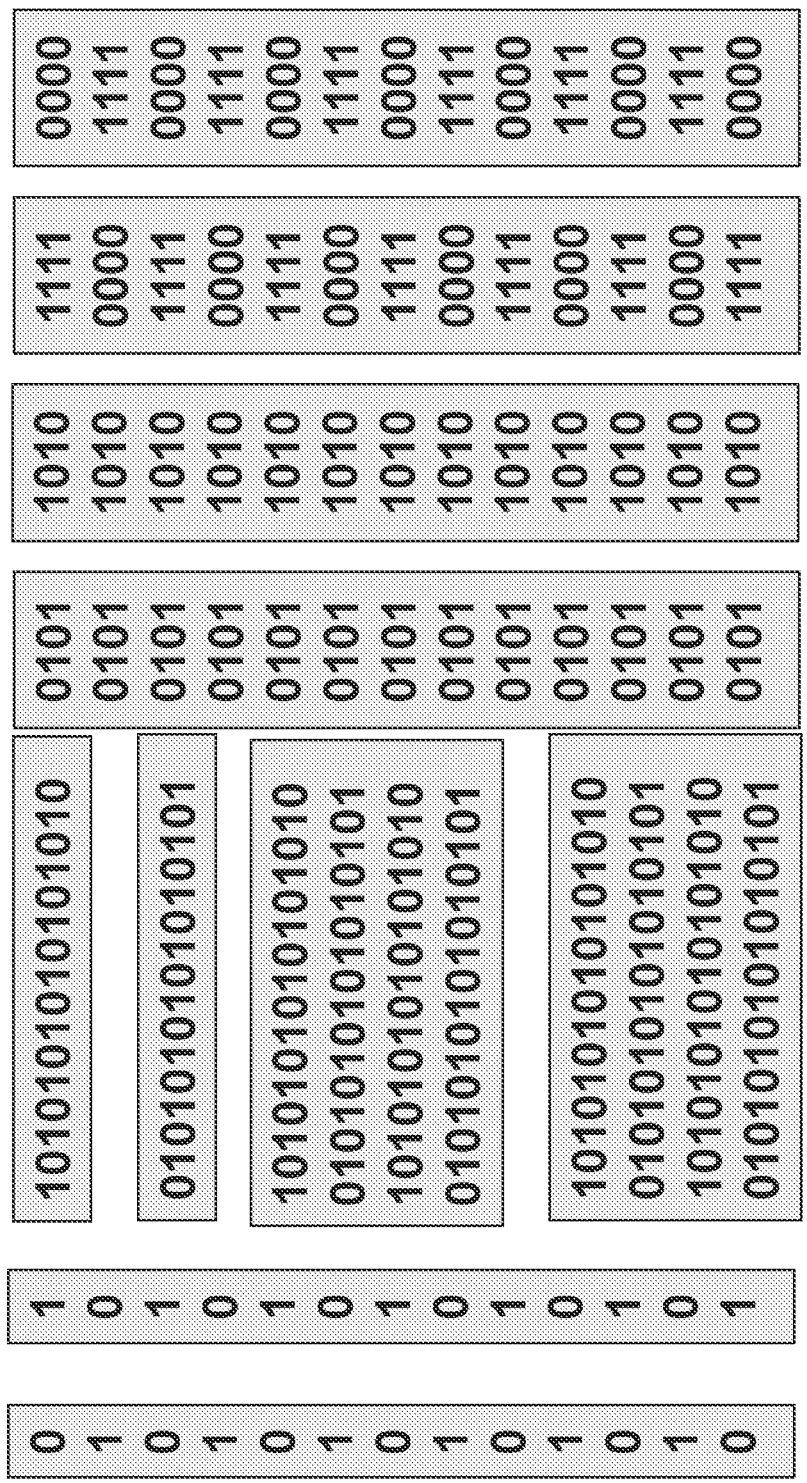
FIG. 8 is an exemplary pattern of logical values in a magnetic sensing array, in accordance with some embodiments.

FIG. 8 is an exemplary pattern of logical values in magnetic sensing array 102, according to some embodiments. The pattern can include logical values of 0 or 1 randomly assigned and stored in the magnetic sensing elements of magnetic sensing array 102. The pattern can include rows and columns of logical values of 0 or 1 stored in the magnetic sensing elements. The pattern can include a geometric pattern such as a checkerboard pattern or an inverse checkerboard pattern. Control unit 104 can send a read signal to magnetic sensing array 102 to read the initial logical values of the magnetic sensing elements. If an external magnetic field exists, one or more logical values of the magnetic sensing elements can be flipped by the external magnetic field. For example, one or more logical values can change from a logical 0 to a logical 1, and one or more logical values can change from a logical 1 to a logical 0. Control unit 104 can send another read signal to magnetic sensing array 102 to read the logical values of the magnetic sensing elements after being influenced by the external magnetic field. Control unit 104 can compare the initial logical values and the logical values after being influenced by the external magnetic field to calculate a flip rate. The flip rate can be calculated by the total number of flipped logical values divided by the total number of magnetic sensing elements. In some embodiments, after each determination of a flip rate, the logical values in magnetic sensing array 102 can be reset to the initial logical values. In some embodiments, the logical values in magnetic sensing array 102 can remain as what have been influenced by the external magnetic field. To sense a new external magnetic field, control unit 104 can send a read signal to magnetic sensing array 102 to read the influenced logical values first as the new baseline logical values to calculate a new flip rate.

Figure 9A:
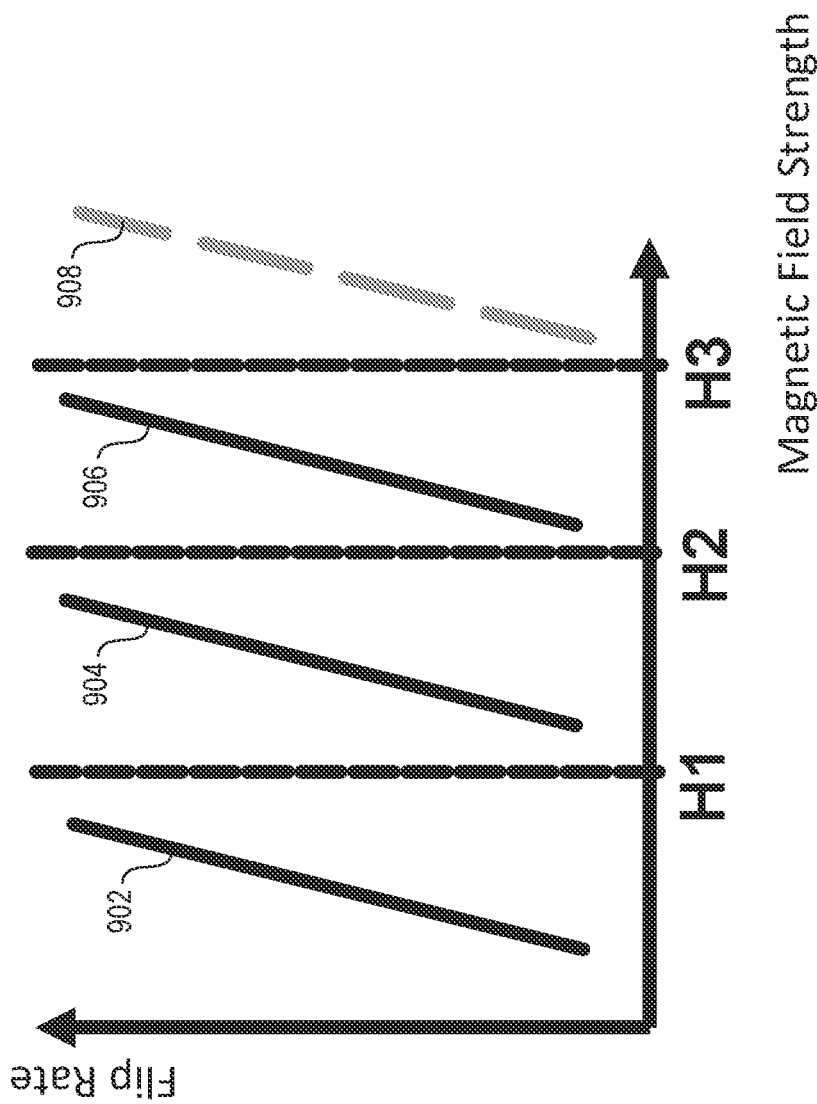
FIGS. 9A and 9B are plots of flip rate with respect to magnetic field strength, in accordance with some embodiments.
Figure 9B:
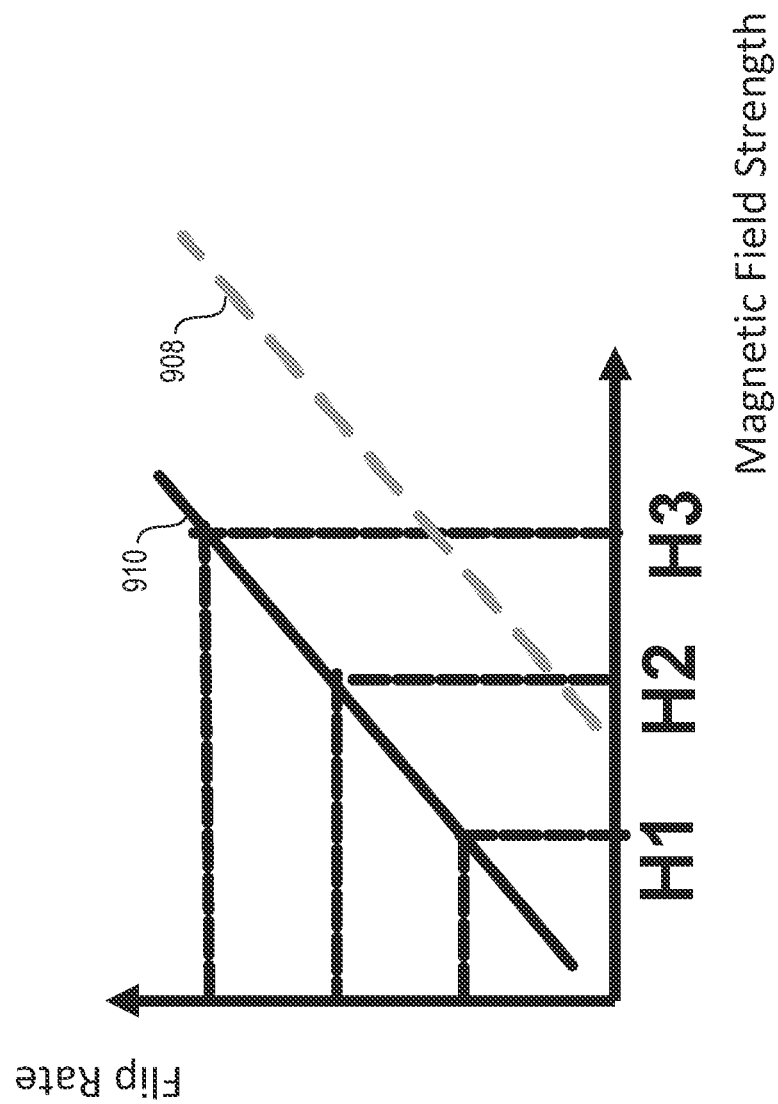

FIGS. 9A and 9B are plots of flip rate with respect to magnetic field strength, according to some embodiments. Referring to FIG. 9A, magnetic sensing array 102 can include several sections of magnetic sensing elements and each section can sense a range of magnetic field strengths. Magnetic sensing elements can be designed with different shapes, sizes, and spacings such that each section of the magnetic sensing elements can have a different sensitivity to a different range of magnetic field strengths. For example, plot 902 can be flip rate with respect to magnetic field strength for the range of magnetic field strengths below about H1; plot 904 can be flip rate with respect to magnetic field strength for the range of magnetic field strengths between about H1 and about H2; plot 906 can be flip rate with respect to magnetic field strength for the range of magnetic field strengths between about H2 and about H3. Cumulatively, the several sections of magnetic sensing elements can sense a wide range of magnetic field strengths. An external magnetic field can be sensed by a corresponding section of magnetic sensing elements. Within each range, as the external magnetic field strength increases, the flip rate increases. Based on the correlation between the flip rate and the magnetic field strength, the external magnetic field strength can be determined. Plot 908 can be flip rate of storage array 110 with respect to magnetic field strength. Logical values in storage array 110 can flip when the range of magnetic field strengths is above about H3. Logical values in magnetic sensing array 102 can flip at a lower magnetic field strength than logical values in storage array 110. This can ensure that magnetic sensing array 102 senses the external magnetic field before the external magnetic field reaches a level that reduces data storage integrity.

Referring to FIG. 9B, magnetic sensing array 102 can include one section of magnetic sensing elements that can sense a wide range of magnetic field strengths. For example, plot 910 can be flip rate with respect to magnetic field strength for the range of magnetic field strengths from below about H1 to above about H3. As the external magnetic field strength increases, the flip rate increases. A look-up table can be stored in control unit 104. The look-up table can detail each flip rate corresponding to each external magnetic field strength. Once a flip rate is obtained, control unit 104 can refer to the look-up table to determine an external magnetic field strength. Plot 908 can be flip rate of storage array 110 with respect to magnetic field strength. Logical values in storage array 110 can flip at a higher magnetic field strength than logical values in magnetic sensing array 102. This can ensure that magnetic sensing array 102 senses the external magnetic field before the external magnetic field reaches a level that reduces data storage integrity.

Figure 10:
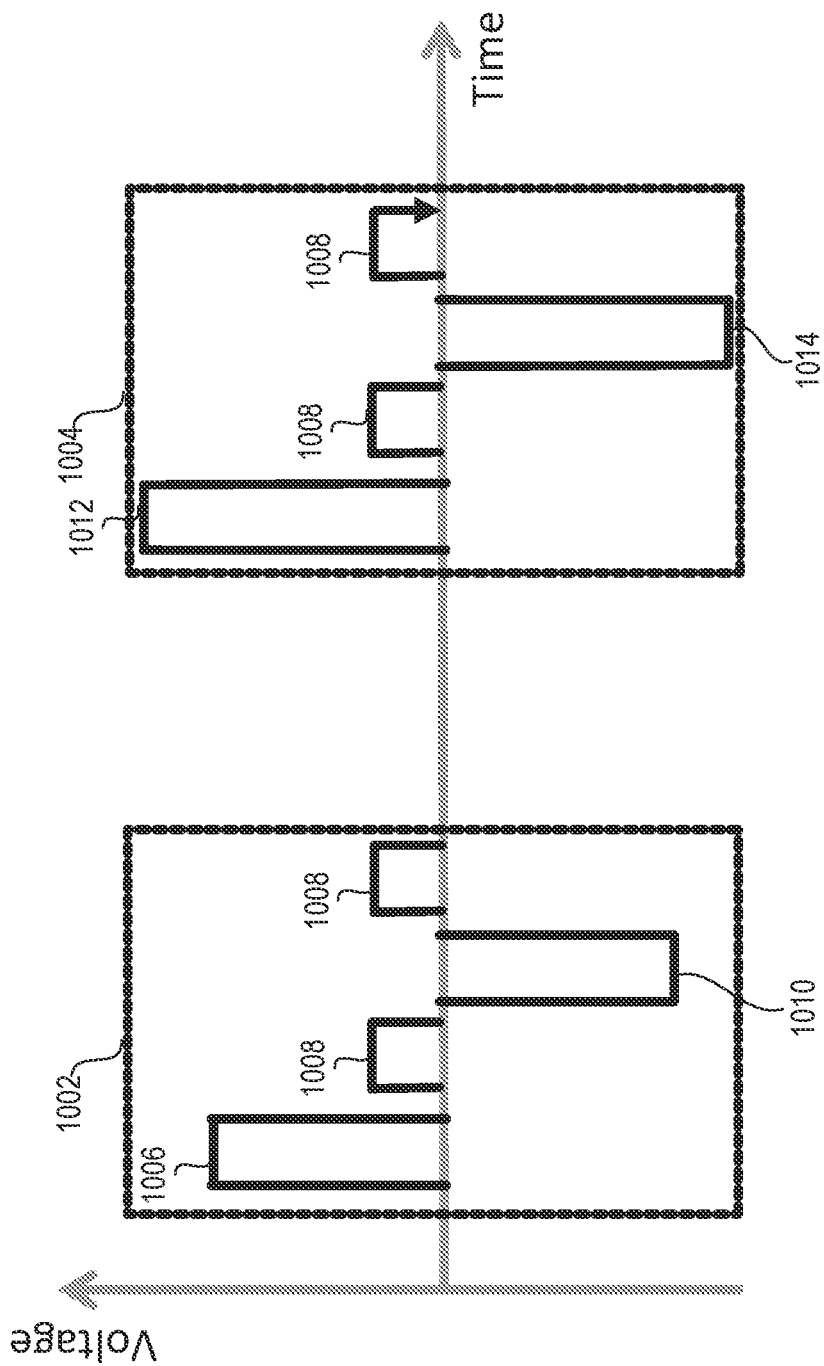
FIG. 10 is a diagram of test voltages provided by a voltage modulator, in accordance with some embodiments.

FIG. 10 is a diagram of test voltages 1002 and 1004 provided by voltage modulator 106, according to some embodiments. Test voltage 1002 can include a write 0 voltage 1006, a read voltage 1008, and a write 1 voltage 1010. Test voltage 1004 can include a write 0 voltage 1012 that is greater than write 0 voltage 1006 in absolute value, read voltage 1008, and a write 1 voltage 1014 that is greater than write 1 voltage 1010 in absolute value. External magnetic fields affect read operations to a lesser degree than external magnetic fields affect write operations. Therefore, read voltage 1008 can stay the same in test voltages 1002 and 1004. In some embodiments, test voltages 1002 and 1004 can omit read voltages. In some embodiments, test voltages 1002 and 1004 can include a write 0 voltage or a write 1 voltage instead of both.

When an external magnetic field strength is above a threshold magnetic field strength, voltage modulator 106 can provide test voltage 1002. Error check array 108 can use write 0 voltage 1006 of test voltage 1002 to write logical values of 0 to the error check elements. Error check array 108 or control unit 104 can calculate a bit error rate of writing logical values of 0. If the bit error rate of writing logical values of 0 is equal to or less than a threshold bit error rate, write 0 voltage 1006 can be used as the new write 0 voltage for magnetic memory device 100. Similarly, error check array 108 can use write 1 voltage 1010 of test voltage 1002 to write logical values of 1 to the error check elements. Error check array 108 or control unit 104 can calculate a bit error rate of writing logical values of 1. If the bit error rate of writing logical values of 1 is equal to or less than a threshold bit error rate, write 1 voltage 1010 can be used as the new write 1 voltage for magnetic memory device 100. In some embodiments, test voltage 1002 can be repeated between about 500 and about 5000 cycles, between about 100 and about 8000 cycles, and between about 2 and about 10000 cycles. The repetition of test voltage 1002 can increase the accuracy of the bit error rate calculation. If the repetition is less than about 2 cycles, the accuracy of the bit error rate calculation can be too low. If the repetition is greater than about 10000 cycles, the time used to obtain the bit error rate can be too great.

If the bit error rate corresponding to test voltage 1002 is greater than the threshold bit error rate, test voltage 1002 cannot be used as the new write voltage for magnetic memory device 100. Voltage modulator 106 can continue to provide test voltage 1004 with different absolute values of write voltages. Error check array 108 can use write 0 voltage 1012 of test voltage 1004 to write logical values of 0 to the error check elements. Error check array 108 or control unit 104 can calculate a bit error rate of writing logical values of 0. If the bit error rate of writing logical values of 0 is equal to or less than the threshold bit error rate, write 0 voltage 1012 can be used as the new write 0 voltage for magnetic memory device 100. Similarly, error check array 108 can use write 1 voltage 1014 of test voltage 1004 to write logical values of 1 to the error check elements. Error check array 108 or control unit 104 can calculate a bit error rate of writing logical values of 1. If the bit error rate of writing logical values of 1 is equal to or less than the threshold bit error rate, write 1 voltage 1014 can be used as the new write 1 voltage for magnetic memory device 100. Test voltage 1004 can be similarly repeated between about 2 and about 10000 cycles to increase the accuracy of the bit error rate calculation.

If the bit error rate corresponding to test voltage 1004 is greater than the threshold bit error rate, test voltage 1004 cannot be used as the new write voltage for magnetic memory device 100. Voltage modulator 106 can continue to provide more test voltages with different absolute values of write voltages. In some embodiments, voltage modulator 106 can provide more test voltages with incrementally greater absolute values, with incrementally smaller absolute values, or with oscillating absolute values. In some embodiments, voltage modulator 106 can provide between about 10 and about 50 test voltages, between about 5 and about 80 test voltages, and between about 3 and about 100 test voltages. If the number of test voltages provided is less than about 3, a new write voltage of magnetic memory device 100 may not be found if all of the test voltages fail to pass the threshold bit error rate. If the number of test voltages provided is greater than about 100, the time used to obtain the new write voltage of magnetic memory device 100 can be too great. In some embodiments, voltage modulator 106 can continue to provide test voltages until a suitable new write voltage of magnetic memory device 100 is obtained.

Figure 11:
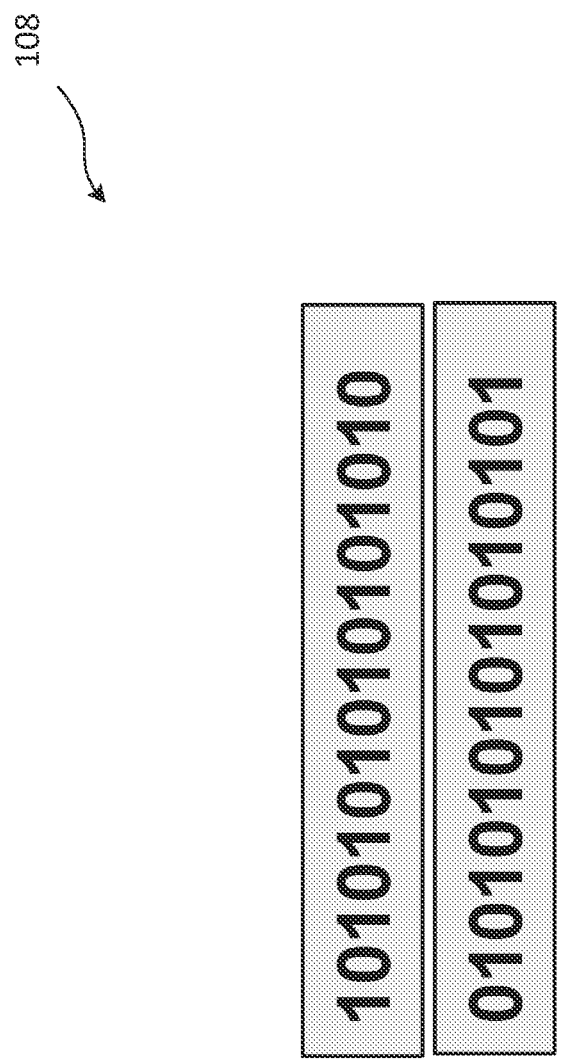
FIG. 11 is an exemplary pattern of logical values in an error check array, in accordance with some embodiments.

FIG. 11 is an exemplary pattern of logical values in error check array 108, according to some embodiments. The pattern can include logical values of 0 or 1 randomly assigned and stored in the error check elements of error check array 108. The pattern can include rows and columns of logical values of 0 or 1 stored in the error check elements. Two rows of logical values of 0 or 1 stored in the error check elements are shown in FIG. 11. The pattern can include a geometric pattern, such as a checkerboard pattern or an inverse checkerboard pattern. To calculate a bit error rate, control unit 104 can send a read signal to error check array 108 to read the initial logical values of the error check elements. After voltage modulator 106 provides a test voltage, such as test voltage 1002 or 1004, error check array 108 can use the test voltage as a write voltage to write the same logical value into each error check element. Control unit 104 can send a read signal to error check array 108 to read the written logical values. Control unit 104 can compare the written logical values and the initial logical values. If a written logical value is different from an initial logical value, a bit error has occurred. If there is one cycle of write operations, the total number of write operations is the same as the total number of error check elements. The total number of bit errors divided by the total number of error check elements can be the bit error rate. If the test voltage is repeated, the total number of write operations can be the total number of error check elements times the number of repeats. The bit error rate can be calculated by the total number of bit errors divided by the total number of write operations. In some embodiments, error check array 108 can calculate the bit error rate and provide the bit error rate to control unit 104. Control unit 104 can compare the bit error rate with a threshold bit error rate. In some embodiments, after each test voltage, the logical values in the error check elements can be reset to the initial logical values. In some embodiments, the logical values in the error check elements can remain as what have been written using the test voltage as the write voltage. For a new test voltage, control unit 104 can send a read signal to error check array 108 to read the written logical values first as the new baseline logical values to calculate a new bit error rate.

Figure 12A:
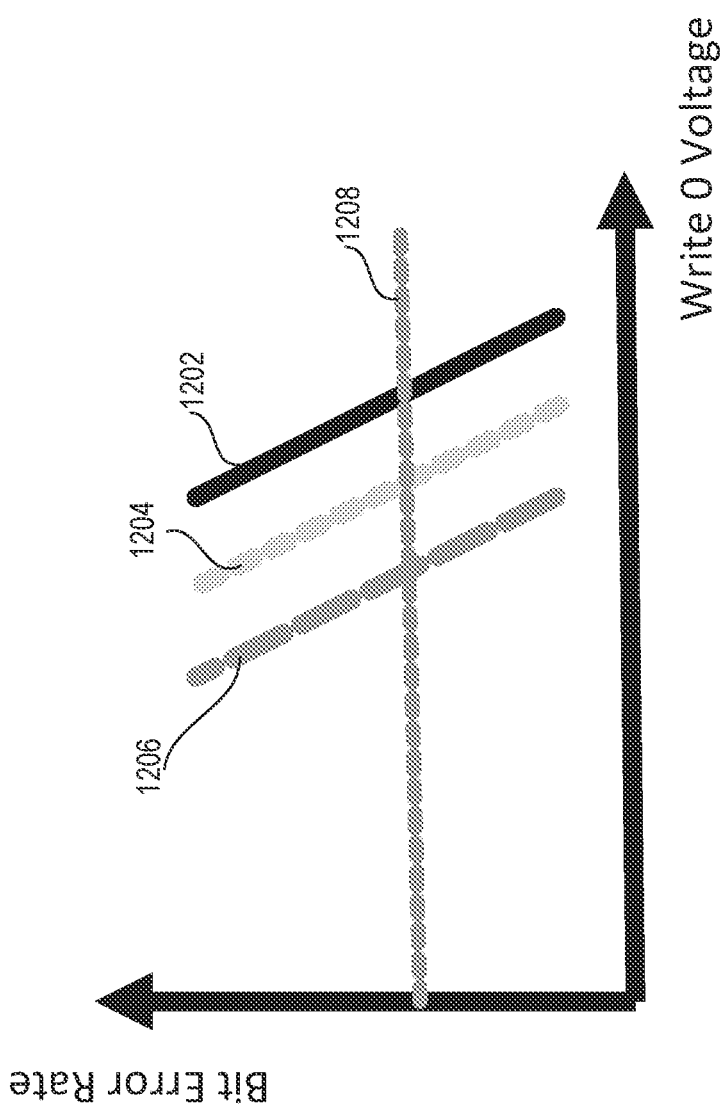
FIGS. 12A and 12B are plots of bit error rate with respect to a write 0 voltage and a write 1 voltage, respectively, in accordance with some embodiments.
Figure 12B:
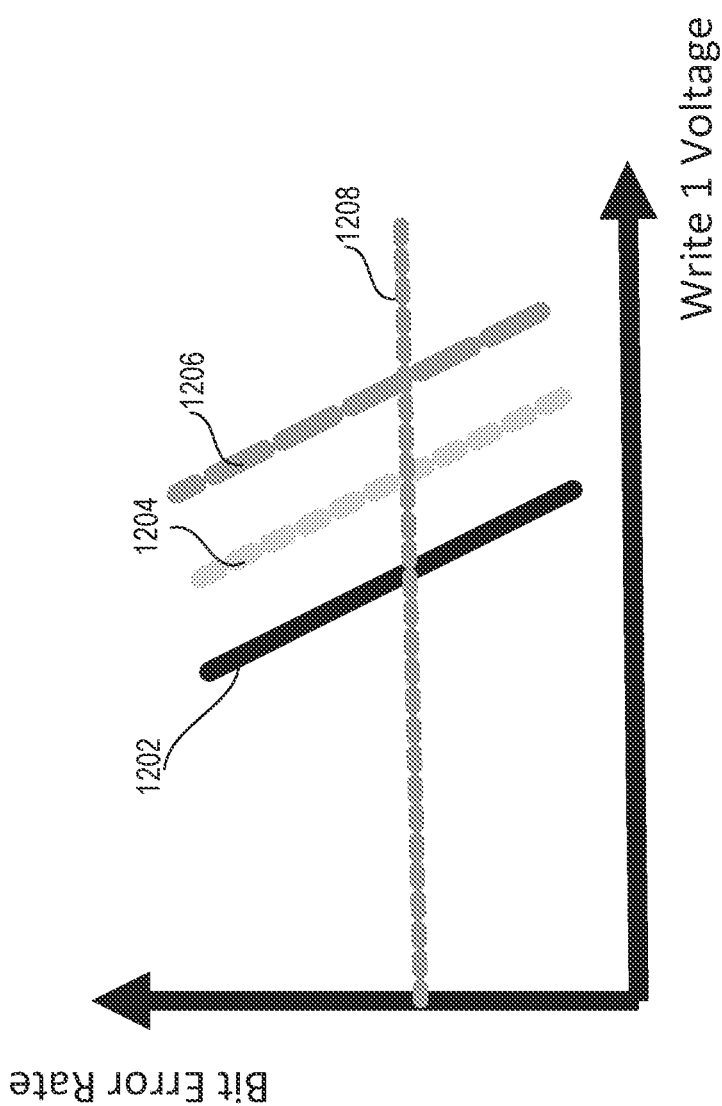

FIGS. 12A and 12B are plots of bit error rate with respect to a write 0 voltage and a write 1 voltage, respectively, according to some embodiments. Referring to FIG. 12A, plot 1204 can be a bit error rate with respect to the write 0 voltage when there is no external magnetic field. As the write 0 voltage increases, the bit error rate decreases. Once the bit error rate is equal to a threshold bit error rate 1208, any write 0 voltage greater than the threshold write 0 voltage can be used. However, it can be more reliable to provide a lower write voltage than a higher write voltage. Therefore, a write 0 voltage that is closer to the threshold write 0 voltage can be more reliably implemented. Plot 1202 can be a bit error rate with respect to the write 0 voltage when there is an external magnetic field with a first polarity such as +H. If the write 0 voltage is kept at the same write 0 voltage when there is no external magnetic field, the bit error rate when there is +H would be greater than threshold bit error rate 1208. To reduce the bit error rate, the write 0 voltage must be increased. Plot 1206 can be a bit error rate with respect to the write 0 voltage when there is an external magnetic field with a second polarity such as −H. If the write 0 voltage is kept at the same write 0 voltage when there is no external magnetic field, the bit error rate when there is −H would be less than threshold bit error rate 1208. However, to improve the reliability of implementing the write 0 voltage when there is −H, the write 0 voltage should be decreased.

Referring to FIG. 12B, plot 1204 can be a bit error rate with respect to the write 1 voltage when there is no external magnetic field. As the write 1 voltage increases, the bit error rate decreases. Once the bit error rate is equal to threshold bit error rate 1208, any write 1 voltage greater than the threshold write 1 voltage can be used. However, it can be more reliable to provide a lower write voltage than a higher write voltage. Therefore, a write 1 voltage that is closer to the threshold write 1 voltage can be more reliably implemented. Plot 1202 can be a bit error rate with respect to the write 1 voltage when there is an external magnetic field with a first polarity such as +H. If the write 1 voltage is kept at the same write 1 voltage when there is no external magnetic field, the bit error rate when there is +H would be less than threshold bit error rate 1208. However, to improve the reliability of implementing the write 1 voltage when there is +H, the write 1 voltage should be decreased. Plot 1206 can be a bit error rate with respect to the write 1 voltage when there is an external magnetic field with a second polarity such as −H. If the write 1 voltage is kept at the same write 1 voltage when there is no external magnetic field, the bit error rate when there is −H would be greater than threshold bit error rate 1208. To reduce the bit error rate, the write 1 voltage must be increased. When there is +H, the write 0 voltage should be increased and the write 1 voltage should be decreased to maintain the bit error rate at the same level. When there is −H, the write 0 voltage should be decreased and the write 1 voltage should be increased to maintain the bit error rate at the same level.

Figure 13:
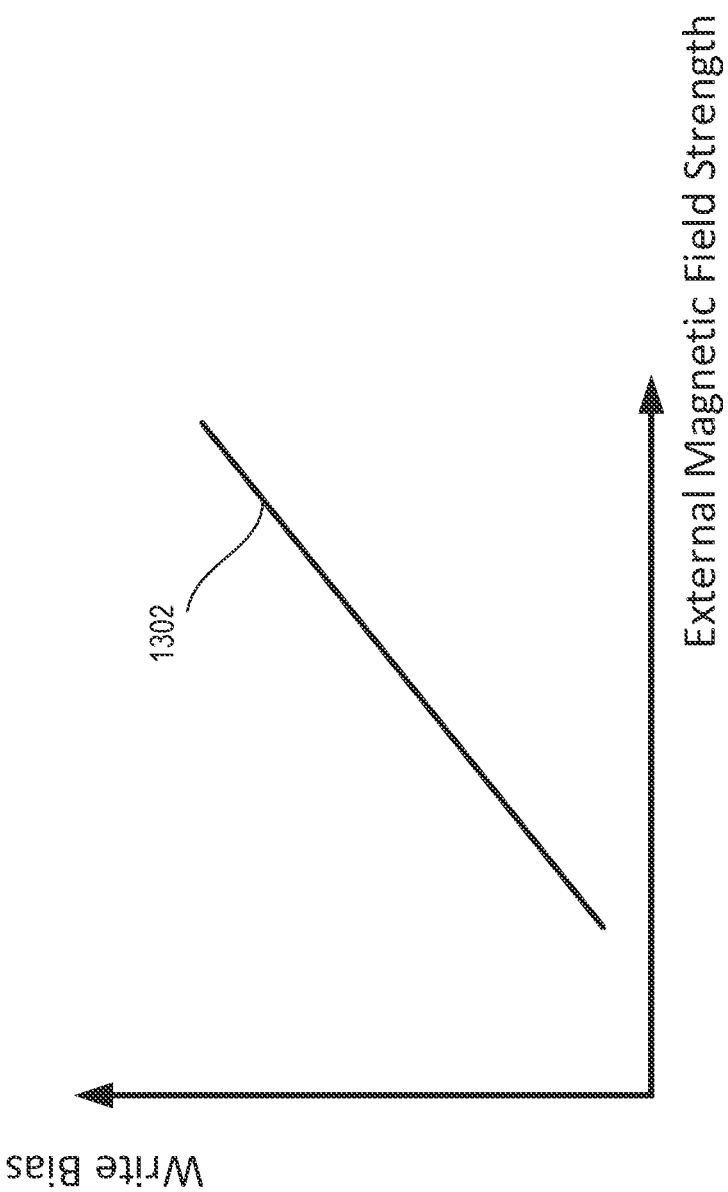
FIG. 13 is a plot of write bias with respect to external magnetic field strength, in accordance with some embodiments.

FIG. 13 is a plot of write bias with respect to external magnetic field strength, according to some embodiments. Plot 1302 can be write bias with respect to external magnetic field strength. As the external magnetic field strength increases, the write bias will need to be increased. For example, when the external magnetic field strength increases, a larger absolute value of the write 0 voltage and the write 1 voltage must be adjusted.

Figure 14:
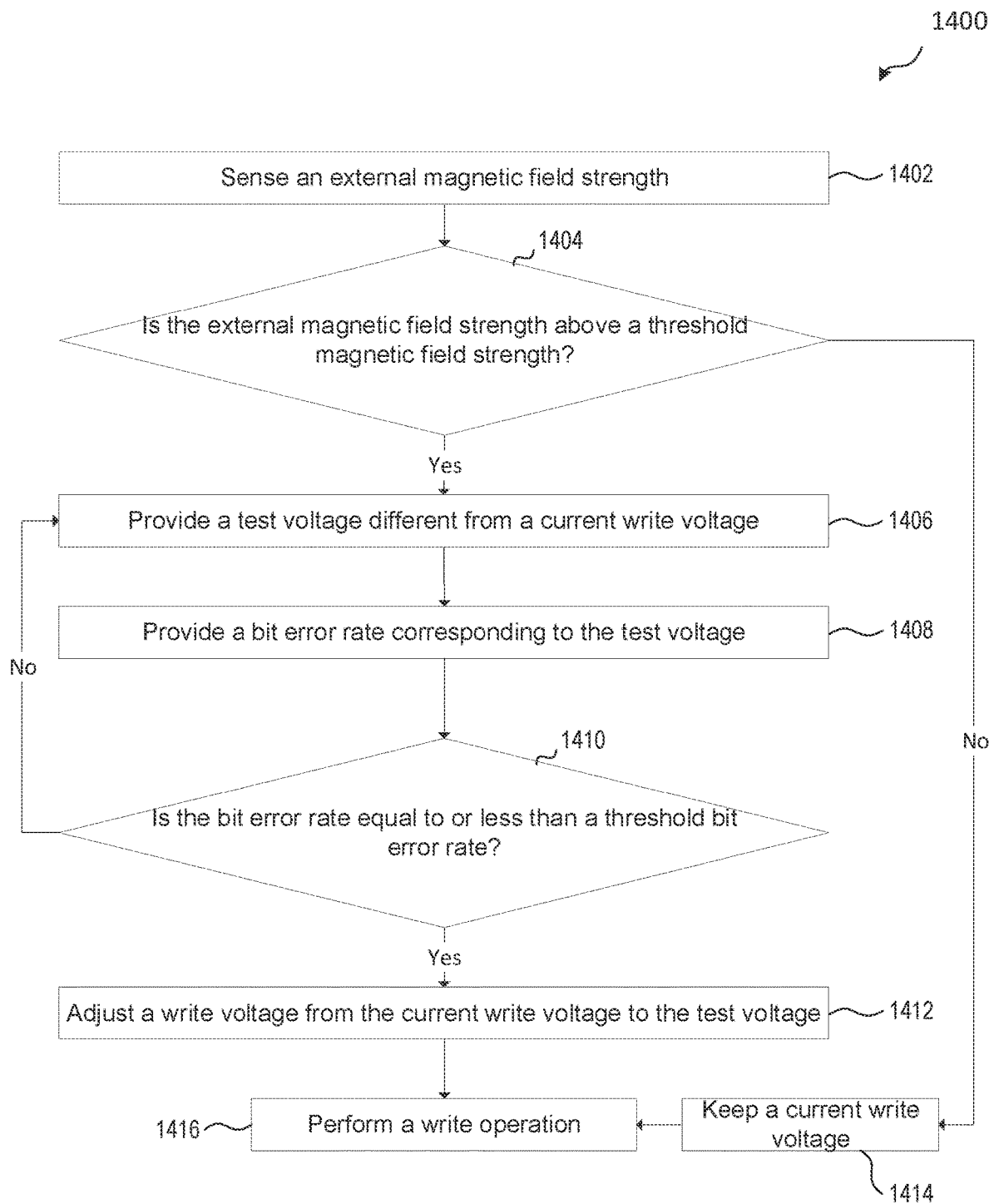
FIG. 14 is a flow diagram of a method for operating a magnetic memory device, in accordance with some embodiments.

FIG. 14 is a flow diagram of a method 1400 for operating magnetic memory device 100, according to some embodiments. Additional operations can be performed between the various operations of method 1400 and are omitted for simplicity. These additional operations are within the spirit and the scope of this disclosure. Moreover, not all operations may be required to perform the disclosure provided herein. Additionally, some of the operations can be performed simultaneously or in a different order than the ones shown in FIG. 14. It is understood that additional operations can be performed before, during, and after method 1400, and that some other operations may only be briefly described herein.

In operation 1402, an external magnetic field strength can be sensed. The external magnetic field strength can be sensed by magnetic sensing array 102. Magnetic sensing array 102 can include a number of magnetic sensing elements with initial logical values of 0 or 1 arranged in a pattern. When an external magnetic field exists, one or more magnetic sensing elements can flip their logical values, such as changing from a logical 0 to a logical 1 or changing from a logical 1 to a logical 0. The higher the external magnetic field strength is, the greater the flip rate is. Therefore, magnetic sensing array 102 can sense the external magnetic field strength based on the flip rate. A sensitivity of magnetic sensing array 102 to sense the external magnetic field strength can depend on a shape or a size of the magnetic sensing elements and a spacing between the adjacent magnetic sensing elements. In some embodiments, magnetic sensing array 102 can include one or more magnetic sensing sections and each magnetic sensing section can sense a range of external magnetic field strengths. Cumulatively, the one or more magnetic sensing sections can sense a wide range of external magnetic field strengths.

In operation 1404, a determination can be made whether the external magnetic field strength is above a threshold magnetic field strength. The determination can be made by control unit 104. If the sensed external magnetic field strength is below the threshold magnetic field strength, the external magnetic field strength has no effect on data storage accuracy and reliability. In operation 1414, a current write voltage of magnetic memory device 100 can be kept. In operation 1416, a write operation can be performed by magnetic memory device 100 using the current write voltage. Data can be written into storage array 110. In some embodiments, for example, if the sensed external magnetic field strength is below about 100 Oe, the write voltage of magnetic memory device 100 can remain the same.

If the sensed external magnetic field strength is above the threshold magnetic field strength, the external magnetic field strength can reduce data storage accuracy and reliability and the write voltage of magnetic memory device 100 may need to be adjusted. In some embodiments, for example, if the sensed external magnetic field strength is between about 100 Oe and about 1000 Oe, the write voltage of magnetic memory device 100 will need to be adjusted. If the sensed external magnetic field strength is above about 1000 Oe, write operations to magnetic memory device 100 with any write voltage can cause data loss and errors. Therefore, new write operations should not be performed. Data already stored in the magnetic memory device can have a higher tolerance for the external magnetic field and read operations can cause less volatility of the data than write operations. Therefore, read operations of data already stored in the magnetic memory device can be performed.

In operation 1406, a test voltage different from the current write voltage can be provided. The test voltage can be provided by voltage modulator 106. The test voltage can include a write 0 voltage and/or a write 1 voltage. In some embodiments, the test voltage can include a read voltage. In some embodiments, the test voltage can be repeated between about 2 and about 10000 cycles.

In operation 1408, a bit error rate corresponding to the test voltage can be provided. In some embodiments, the bit error rate can be provided by error check array 108. In some embodiments, the bit error rate can be provided by control unit 104.

In operation 1410, a determination can be made whether the bit error rate is equal to or less than a threshold bit error rate. The determination can be made by control unit 104. If the bit error rate is equal to or less than the threshold bit error rate, in operation 1412, control unit 104 can adjust the write voltage of magnetic memory device 100 from the current write voltage to the test voltage. In operation 1416, a write operation can be performed by magnetic memory device 100 using the adjusted write voltage. Data can be written into storage array 110.

If the bit error rate is greater than the threshold bit error rate, the test voltage is not suitable to be the new write voltage under the influence of the sensed external magnetic field and a new test voltage will need to be tested. The method goes back to operation 1406 where a new test voltage can be provided. A bit error rate corresponding to the new test voltage can be provided and compared to the threshold bit error rate. If the bit error rate corresponding to the new test voltage is again greater than the threshold bit error rate, method 1400 goes back to operation 1406 where yet another new test voltage can be provided. The loop can continue until a suitable test voltage can be used as the new write voltage. In some embodiments, between about 3 and about 100 test voltages can be tested to find the suitable new write voltage. In some embodiments, after each test voltage, the logical values in the error check elements can be reset to the initial logical values. In some embodiments, the logical values in the error check elements can remain as what have been written using the test voltage as the write voltage. For a new test voltage, control unit 104 can send a read signal to error check array 108 to read the written logical values first as the new baseline logical values to calculate a new bit error rate. After a suitable new write voltage is determined, in operation 1412, control unit 104 can adjust the write voltage of magnetic memory device 100 from the current write voltage to the suitable new write voltage. In operation 1416, a write operation can be performed by magnetic memory device 100 using the adjusted write voltage. Data can be written into storage array 110.

In some embodiments, method 1400 can be performed before every write operation. In some embodiments, method 1400 can be performed periodically, such as after 10 write operations, after 100 write operations, or after 1000 write operations.

Figure 15:
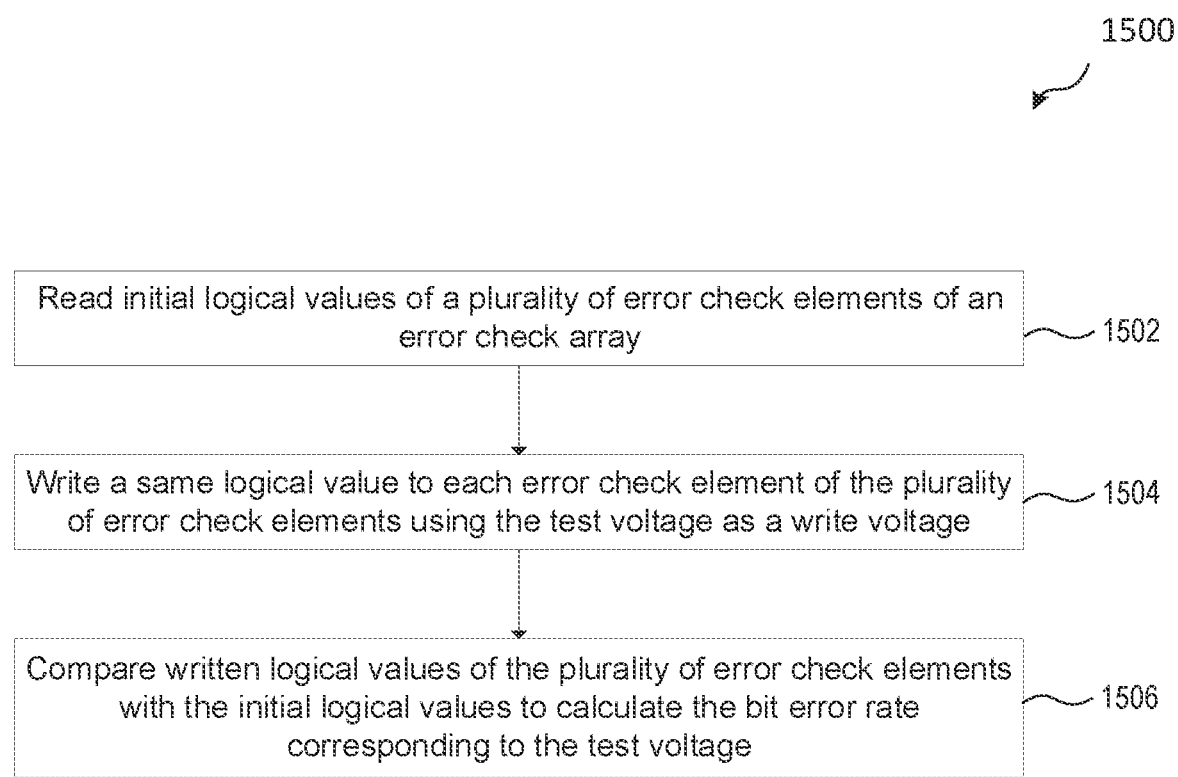
FIG. 15 is a flow diagram of a method for calculating a bit error rate, in accordance with some embodiments.

FIG. 15 is a flow diagram of a method 1500 for calculating a bit error rate corresponding to a test voltage, according to some embodiments. In some embodiments, method 1500 can include detailed operations to perform operation 1408 of method 1400 as shown in FIG. 14.

In operation 1502, control unit 104 can send a read signal to error check array 108 to read the initial logical values of the error check elements. In operation 1504, after voltage modulator 106 provides a test voltage, such as test voltage 1002 or 1004, error check array 108 can use the test voltage as a write voltage to write the same logical value into each error check element. In operation 1506, control unit 104 can send a read signal to error check array 108 to read the written logical values. Control unit 104 can compare the written logical values and the initial logical values. If a written logical value is different from an initial logical value, a bit error has occurred. If there is one cycle of write operations, the total number of write operations is the same as the total number of error check elements. The total number of bit errors divided by the total number of error check elements can be the bit error rate. If the test voltage is repeated, the total number of write operations can be the total number of error check elements times the number of repeats. The bit error rate can be calculated by the total number of bit errors divided by the total number of write operations. In some embodiments, error check array 102 can calculate the bit error rate and provide the bit error rate to control unit 104.

The present disclosure provides an example magnetic memory device (e.g., magnetic memory device 100) with improved data storage accuracy and reliability and an example method (e.g., methods 1400 and 1500) for operating the same. The magnetic memory device can include a magnetic sensing array (e.g., magnetic sensing array 102). The magnetic sensing array can include a number of magnetic sensing elements with initial logical values of 0 or 1 arranged in a pattern. The magnetic sensing array can sense an external magnetic field strength based on a flip rate of the initial logical values under the influence of the external magnetic field. If the sensed external magnetic field strength is below a threshold magnetic field strength, the external magnetic field has no effect on data storage accuracy and reliability and the write voltage of the magnetic memory device can remain the same. In some embodiments, for example, if the sensed external magnetic field strength is below about 100 Oe, the write voltage of the magnetic memory device can remain the same. If the sensed external magnetic field strength is above the threshold magnetic field strength, the external magnetic field can reduce data storage accuracy and reliability and the write voltage of the magnetic memory device may need to be adjusted. In some embodiments, for example, if the sensed external magnetic field strength is between about 100 Oe and about 1000 Oe, the write voltage of the magnetic memory device will need to be adjusted. If the sensed external magnetic field strength is above about 1000 Oe, write operations to the magnetic memory device with any write voltage can cause data loss and errors. Therefore, new write operations should not be performed. Data already stored in the magnetic memory device can have a higher tolerance for the external magnetic field and read operations can cause less volatility of the data than write operations. Therefore, read operations of data already stored in the magnetic memory device can be performed.

To adjust the write voltage of the magnetic memory device, the magnetic memory device can include a voltage modulator (e.g., voltage modulator 106) and an error check array (e.g., error check array 108). The voltage modulator can provide a test voltage (e.g., test voltage 1002) different from a current write voltage of the magnetic memory device. The error check array can use the test voltage as the write voltage to write logical values and provide a bit error rate. In some embodiments, the test voltage can be repeated between about 2 and 10000 cycles to improve the accuracy of the bit error rate. If the bit error rate is equal to or less than a threshold bit error rate (e.g., threshold bit error rate 1208), the test voltage can be used as the new write voltage under the influence of the sensed external magnetic field. If the bit error rate is greater than the threshold bit error rate, the test voltage is not a suitable write voltage under the influence of the sensed external magnetic field and a new test voltage (e.g., test voltage 1004) will need to be tested. In some embodiments, between about 3 and about 100 test voltages can be tested to find the suitable new write voltage.

In some embodiments, the external magnetic field can be sensed before every write operation. In some embodiments, the external magnetic field can be sensed periodically, such as after 10 write operations, after 100 write operations, or after 1000 write operations. The magnetic memory device with the magnetic sensing array, the voltage modulator, and the error check array can adjust write voltages according to external magnetic field strengths. The adjusted write voltages can improve data storage accuracy and reliability.

In some embodiments, a magnetic memory device includes a magnetic sensing array configured to sense an external magnetic field strength. The magnetic memory device further includes a voltage modulator configured to, in response to the external magnetic field strength being greater than a threshold magnetic field strength, provide a test voltage different from a current write voltage of the magnetic memory device. The magnetic memory device further includes an error check array configured to use the test voltage as a write voltage of the error check array and provide a bit error rate corresponding to the test voltage. The magnetic memory device further includes a control unit configured to adjust, based on the bit error rate being equal to or less than a threshold bit error rate, a write voltage of the magnetic memory device from the current write voltage to the test voltage.

In some embodiments, a magnetic memory device includes a magnetic sensing array including a number of magnetic sensing elements with first initial logical values arranged in a pattern, where the magnetic sensing array is configured to sense an external magnetic field strength based on a flip rate of the first initial logical values. The magnetic memory device further includes a voltage modulator configured to, in response to the external magnetic field strength being greater than a threshold magnetic field strength, provide a test voltage different from a current write voltage of the magnetic memory device. The magnetic memory device further includes an error check array including a number of error check elements with second initial logical values, where the error check array is configured to read the second initial logical values of the number of error check elements, write a same logical value to each error check element of the number of error check elements using the test voltage as a write voltage, and compare written logical values of the number of error check elements with the second initial logical values to calculate a bit error rate corresponding to the test voltage. The magnetic memory device further includes a control unit configured to adjust, based on the bit error rate being equal to or less than a threshold bit error rate, a write voltage of the magnetic memory device from the current write voltage to the test voltage.

In some embodiments, a method for operating a magnetic memory device includes sensing, by a magnetic sensing array, an external magnetic field strength and providing, in response to the external magnetic field strength being greater than a threshold magnetic field strength, a test voltage different from a current write voltage of the magnetic memory device. The method further includes reading initial logical values of a number of error check elements of an error check array, writing a same logical value to each error check element of the number of error check elements using the test voltage as a write voltage, and comparing written logical values of the number of error check elements with the initial logical values to calculate a bit error rate corresponding to the test voltage. The method further includes adjusting, based on the bit error rate being equal to or less than a threshold bit error rate, a write voltage of the magnetic memory device from the current write voltage to the test voltage.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
sensing an external magnetic field strength using a magnetic sensing array;
providing a test voltage different from a current write voltage of a magnetic memory device, in response to the external magnetic field strength of an external magnetic field being greater than a threshold magnetic field strength;
using the test voltage as a write voltage of an error check array and providing a bit error rate corresponding to the test voltage; and
adjusting a write voltage of the magnetic memory device from the current write voltage to the test voltage based on the bit error rate being equal to or less than a threshold bit error rate.

2. The method of claim 1, further comprising sensing a range of external magnetic field strengths using one or more magnetic sensing sections of the magnetic sensing array.

3. The method of claim 1, further comprising sensing the external magnetic field strength based on a flip rate of initial logical values, wherein the magnetic sensing array comprises a plurality of magnetic sensing elements with initial logical values of 0 or 1 arranged in a pattern.

4. The method of claim 3, further comprising:
sending a read signal to the magnetic sensing array to read logical values influenced by the external magnetic field; and
calculating a new flip rate based on the influenced logical values.

5. The method of claim 1, further comprising using the test voltage as the write voltage to write logical values between about 2 and about 10,000 cycles for calculating the bit error rate.

6. The method of claim 5, further comprising providing another test voltage as the write voltage in response to the bit error rate being greater than the threshold bit error rate.

7. The method of claim 1 further comprising writing to a storage array using the adjusted write voltage.

8. The method of claim 1 further comprising:
reading initial logical values of a plurality of error check elements of the error check array;
writing the initial logical values to the plurality of error check elements using the test voltage as the write voltage, under the influence of the external magnetic field; and
comparing written logical values of the plurality of error check elements with the initial logical values to calculate the bit error rate corresponding to the test voltage.

9. A method, comprising:
storing first initial logical values in an arranged pattern in a magnetic sensing array of a magnetic memory device, wherein the magnetic sensing array comprises a plurality of magnetic sensing elements;
sensing an external magnetic field strength based on a flip rate of the first initial logical values;
providing a test voltage different from a current write voltage of the magnetic memory device using a voltage modulator, in response to the external magnetic field strength being greater than a threshold magnetic field strength;
storing a plurality of error check elements with second initial logical values;
reading the second initial logical values of the plurality of error check elements;

writing a same logical value to each error check element of the plurality of error check elements using the test voltage as a write voltage;

comparing written logical values of the plurality of error check elements with the second initial logical values to calculate a bit error rate corresponding to the test voltage; and adjusting the write voltage of the magnetic memory device from the current write voltage to the test voltage, based on the bit error rate being equal to or less than a threshold bit error rate.

10. The method of claim 9, further comprising arranging the plurality of magnetic sensing elements in one or more magnetic sensing sections, and wherein each magnetic sensing section of the one or more magnetic sensing sections is configured to sense a range of external magnetic field strengths.

11. The method of claim 9, further comprising using the test voltage as the write voltage to write logical values between about 2 and about 10,000 cycles for calculating the bit error rate.

12. The method of claim 11, further comprising providing another test voltage as the write voltage in response to the bit error rate being greater than the threshold bit error rate.

13. The method of claim 9, further comprising writing to a storage array using the adjusted write voltage.

14. A magnetic memory device, comprising:
a storage array comprising a plurality of storage elements, wherein each storage element of the plurality of storage elements comprises a magnetic tunnel junction and one or more transistors, and wherein the magnetic tunnel junction is interposed between two metal layers of each storage element;
a magnetic sensing array comprising a plurality of magnetic sensing elements, wherein the magnetic sensing array is configured to sense an external magnetic field strength based on a flip rate of first initial logical values;
a voltage modulator configured to, in response to the external magnetic field strength being greater than a threshold magnetic field strength, provide a test voltage different from a current write voltage of the magnetic memory device;
an error check array comprising a plurality of error check elements with second initial logical values; and
a control device configured to compare a bit error rate to a threshold bit error rate.

15. The magnetic memory device of claim 14, wherein the control device is further configured to adjust, based on the bit error rate being equal to or less than the threshold bit error rate, the write voltage of the magnetic memory device from the current write voltage to the test voltage.

16. The magnetic memory device of claim 14, wherein the error check array is configured to:
read the second initial logical values of the plurality of error check elements;
write a same logical value to each error check element of the plurality of error check elements using the test voltage as a write voltage; and
compare written logical values of the plurality of error check elements with the second initial logical values to calculate a bit error rate corresponding to the test voltage.

17. The magnetic memory device of claim 14, wherein a sensitivity of the magnetic sensing array to sense the external magnetic field strength is based on a shape and a size of each magnetic sensing element of the plurality of magnetic sensing elements and a spacing between adjacent magnetic sensing elements.

18. The magnetic memory device of claim 14, wherein the error check array comprises the plurality of error check elements with initial logical values of 0 or 1 arranged in a pattern, and wherein each error check element of the plurality of error check elements comprises a magnetic data cell and a reference cell.

19. The magnetic memory device of claim 14, wherein each magnetic sensing element of the plurality of magnetic sensing elements comprises a circular shape, a square shape, a triangular shape, a rectangular shape, or an oval shape, wherein each magnetic sensing element has a width between about 10 nm and about 200 nm, and wherein a spacing between adjacent magnetic sensing elements is between about 10 nm and about 1000 nm.

* * * * *